(12) United States Patent
Morita et al.

(10) Patent No.: US 8,383,990 B2
(45) Date of Patent: Feb. 26, 2013

(54) SUBSTRATE TRANSPORT APPARATUS AND HEAT TREATMENT APPARATUS

(75) Inventors: Akihiko Morita, Shimogyo-ku (JP); Kenichi Oyama, Shimogyo-ku (JP); Koji Nishi, Shimogyo-ku (JP)

(73) Assignee: Sokudo Co., Ltd., Kyoto (JP)

( * ) Notice: Subject to any disclaimer, the term of this patent is extended or adjusted under 35 U.S.C. 154(b) by 1133 days.

(21) Appl. No.: 12/045,986

(22) Filed: Mar. 11, 2008

(65) Prior Publication Data

US 2009/0060686 A1 Mar. 5, 2009

(30) Foreign Application Priority Data

Mar. 20, 2007 (JP) ................... 2007-072351

(51) Int. Cl.
| | |
|---|---|
| H01L 21/68 | (2006.01) |
| H05B 1/02 | (2006.01) |
| H05B 3/22 | (2006.01) |
| F27B 5/12 | (2006.01) |
| F27B 5/14 | (2006.01) |

(52) U.S. Cl. ............. 219/390; 219/392; 219/444.1; 118/729

(58) Field of Classification Search .............. None
See application file for complete search history.

(56) References Cited

U.S. PATENT DOCUMENTS

| | | | |
|---|---|---|---|
| 6,229,118 B1 | 5/2001 | Kim et al. | |
| 6,646,233 B2 * | 11/2003 | Okuda et al. | 219/390 |
| 6,814,507 B2 | 11/2004 | Inagaki | |
| 6,893,171 B2 | 5/2005 | Fukutomi et al. | |
| 2005/0215073 A1 | 9/2005 | Nakamura et al. | |

FOREIGN PATENT DOCUMENTS

| | | | |
|---|---|---|---|
| JP | 03095952 A | * | 4/1991 |
| JP | H05-304198 A | | 11/1993 |
| JP | 07142408 A | * | 6/1995 |
| JP | H8-264618 A | | 10/1996 |
| JP | 11-168131 | | 6/1999 |
| JP | 11176902 A | * | 7/1999 |
| JP | 2000119874 A | * | 4/2000 |
| JP | 2001-274078 A | | 10/2001 |

(Continued)

OTHER PUBLICATIONS

KR 757851 BA, Shin et al, Sep. 2007, Abstract and 1 Figure.*

(Continued)

*Primary Examiner* — Joseph M Pelham
(74) *Attorney, Agent, or Firm* — Kilpatrick Townsend & Stockton LLP

(57) ABSTRACT

A chilled arm that transports a substrate to and from a heating plate for performing a heating process on the substrate is formed with a flow passage pipe therein, and cools the entire holding area thereof opposed to the substrate held by the chilled arm to a predetermined reference temperature by supplying circulating cooling water through the flow passage pipe. Six polyimide heaters are affixed to the holding area to control the temperature of at least a portion of the holding area at a temperature different from the reference temperature. These two temperature control mechanisms intentionally provide a temperature distribution to the holding area to thereby provide an intentional temperature distribution to the substrate before and after the heat treatment by the heating plate. This reduces the nonuniformity of a temperature distribution which typically occurs in the heating plate to accomplish a uniform heat treatment throughout the heat treatment process step.

11 Claims, 14 Drawing Sheets

FOREIGN PATENT DOCUMENTS

| | | |
|---|---|---|
| JP | 2001-297977 A | 10/2001 |
| JP | 2002-009129 | 1/2002 |
| JP | 2002-043208 | 2/2002 |
| JP | 2003-100839 A | 4/2003 |
| JP | 2003-347386 A | 12/2003 |
| JP | 2004-342654 | 12/2004 |
| JP | 2005-159018 A | 6/2005 |
| JP | 2005-277074 A | 6/2005 |
| KR | 2001-0019206 | 3/2001 |
| KR | 2005-0121913 | 12/2005 |

OTHER PUBLICATIONS

Office Action of Korean Patent Application No. 10-2008-024736, mailed Dec. 31, 2009, [English Translation Included], 9 pages total.

Office Action in the counterpart Japanese Application No. 2007-072351 dated Mar. 21, 2012, 5 pages.

Office Action in the counterpart Taiwanese Application No. 097107796 dated Jan. 16, 2012, 20 pages.

* cited by examiner

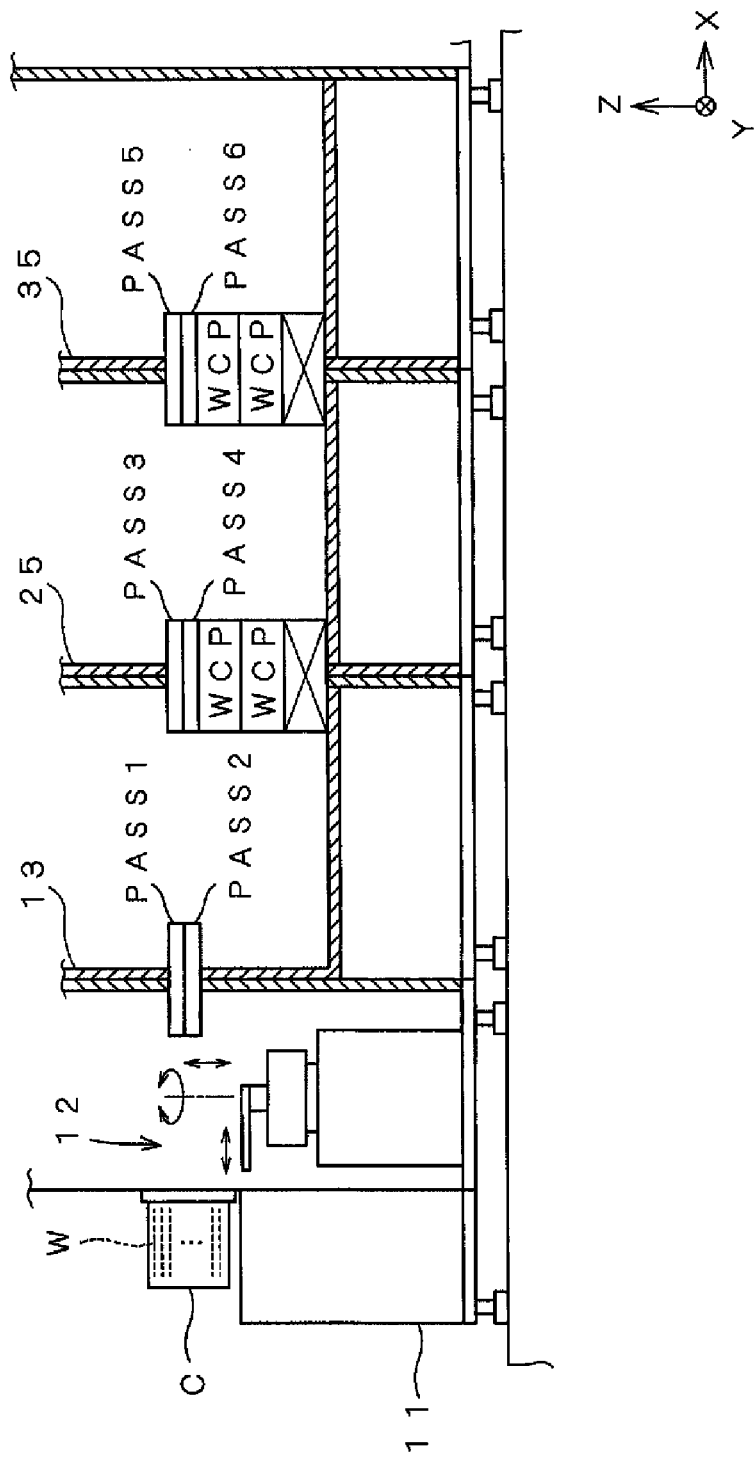

F I G. 9
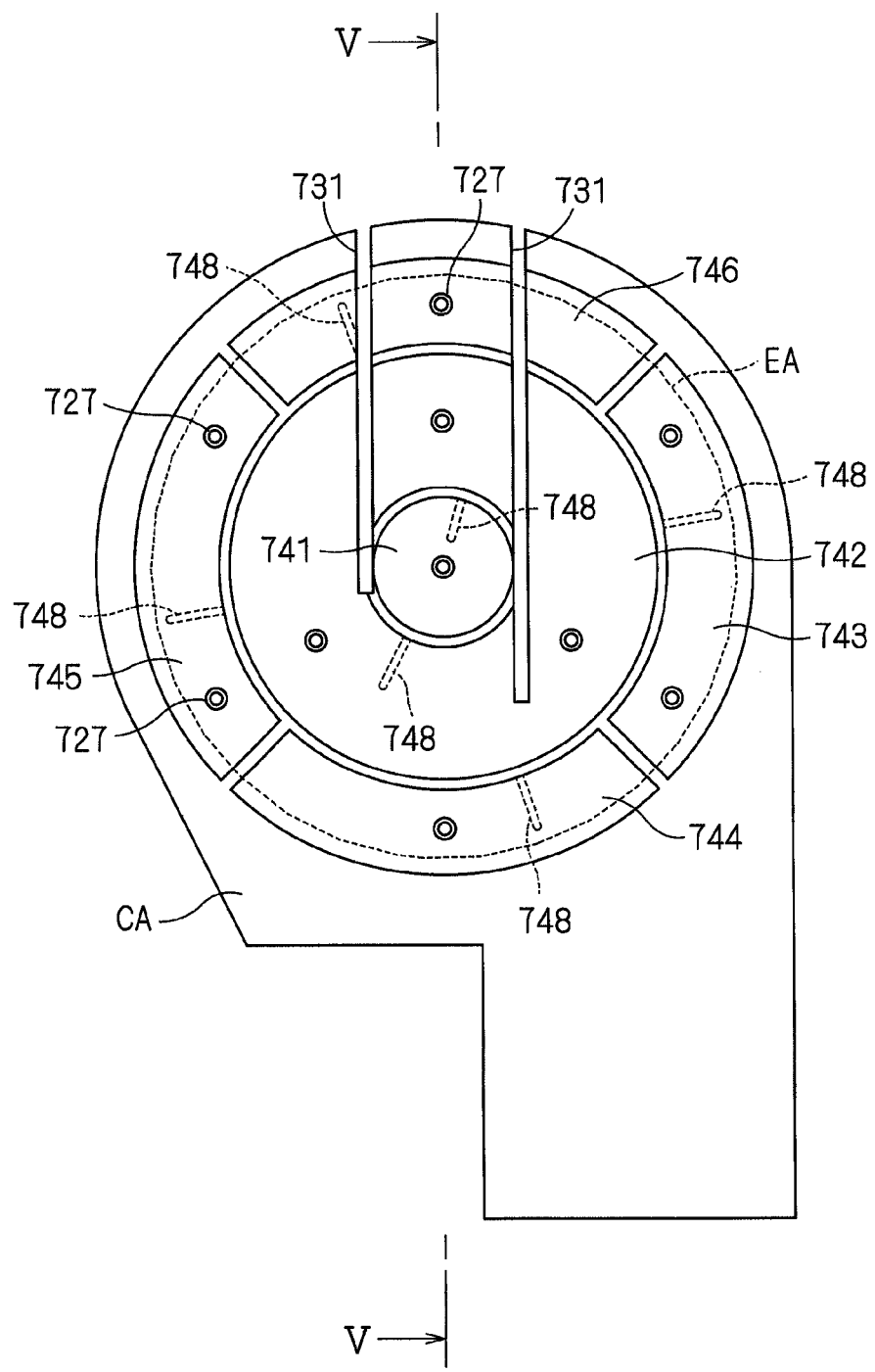

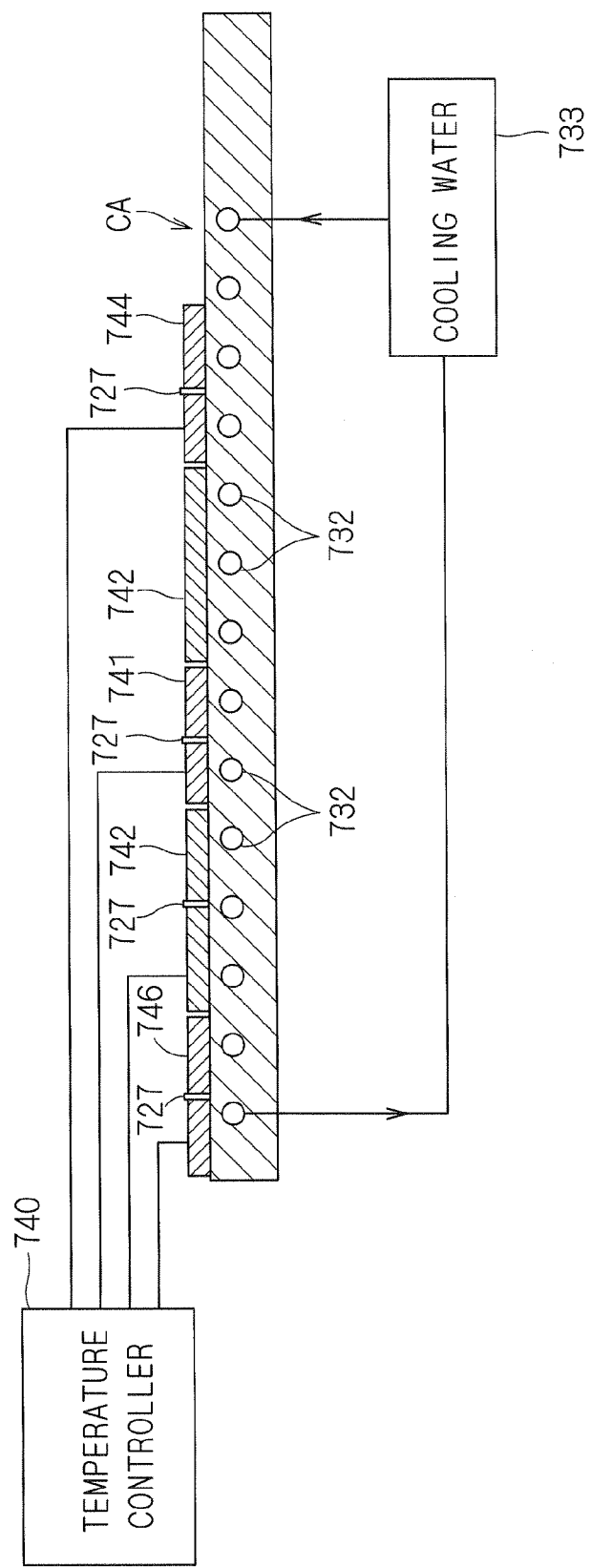

F I G . 1 1
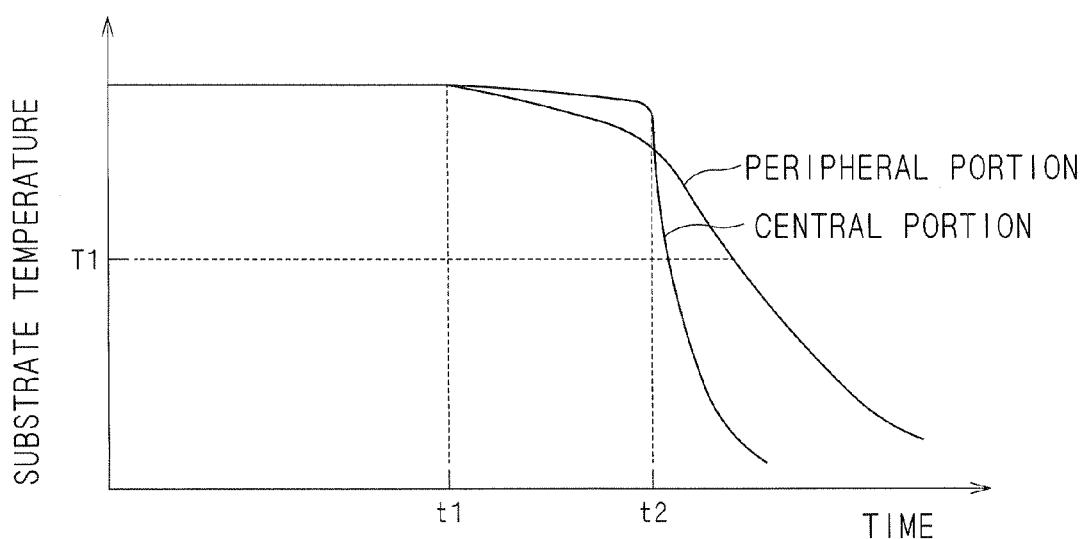

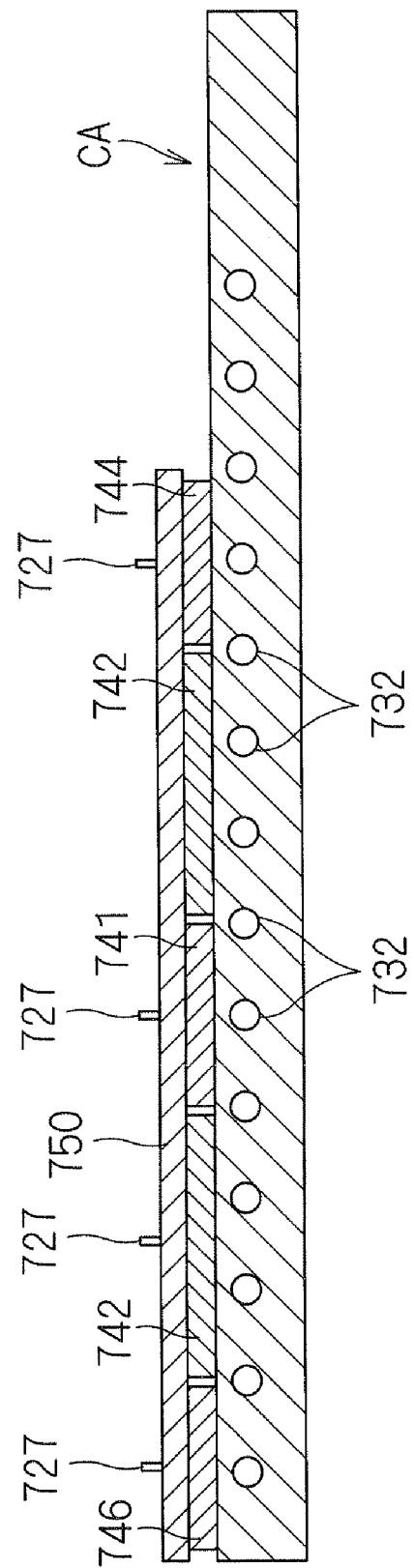

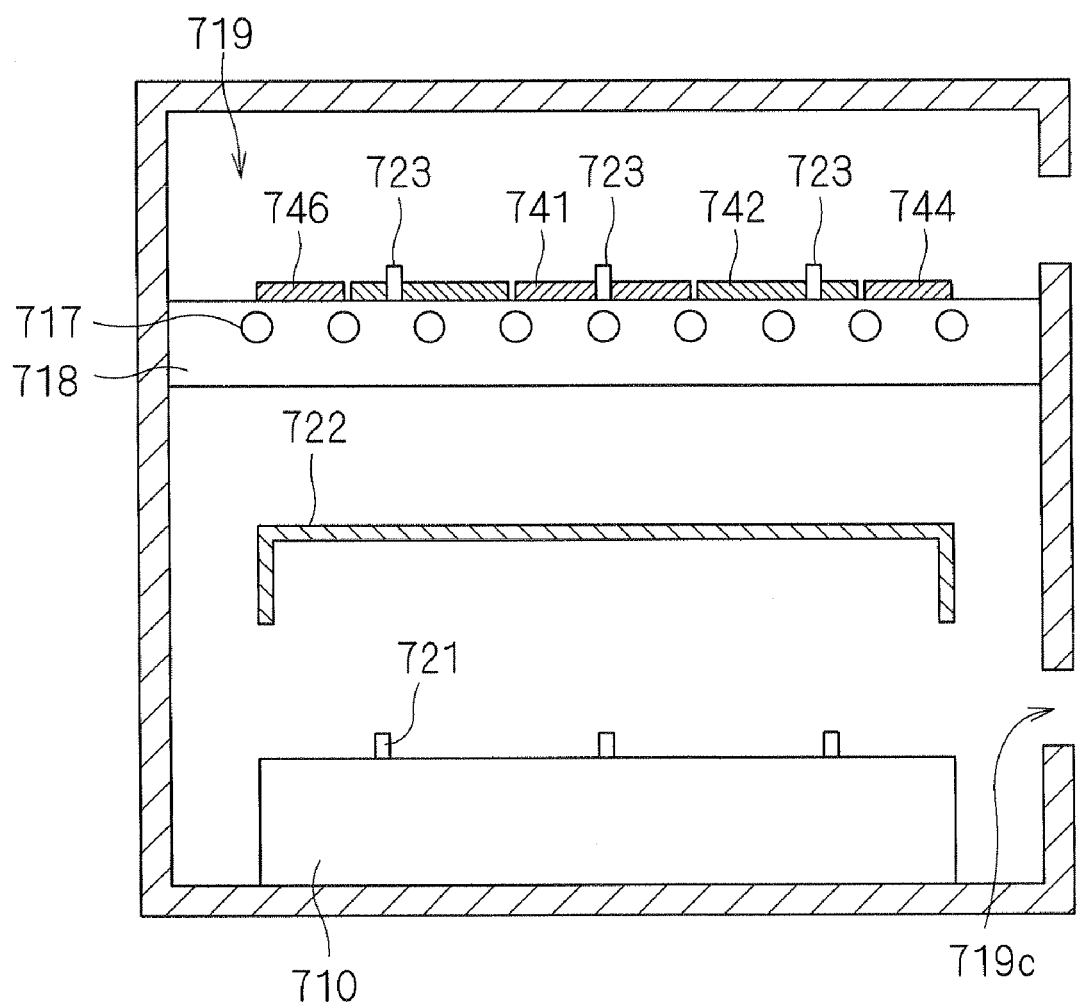
F I G . 1 3

SUBSTRATE TRANSPORT APPARATUS AND HEAT TREATMENT APPARATUS

CROSS-REFERENCES TO RELATED APPLICATIONS

This application claims priority to Japanese Patent Application 2007-072351, filed Mar. 20, 2007. The disclosure of JP 2007-072351 is hereby incorporated by reference in its entirety for all purposes.

BACKGROUND OF THE INVENTION

The present invention relates to a substrate transport apparatus and a heat treatment apparatus which place a substrate such as a semiconductor substrate, a glass substrate for a liquid crystal display device, a glass substrate for a photomask, a substrate for an optical disk and the like on a holding surface to perform a heat treatment on the substrate.

As is well known, semiconductor and liquid crystal display products and the like are fabricated by performing a series of processes including cleaning, resist coating, exposure, development, etching, interlayer insulation film formation, heat treatment, dicing, and the like on the above-mentioned substrate. An apparatus which performs a resist coating process on a substrate to transfer the substrate to an exposure unit and which receives an exposed substrate from the exposure unit to perform a development process on the exposed substrate, among the above-mentioned processes, is widely used as a so-called coater-and-developer.

The exposure unit (also known as a stepper) for performing an exposure process is typically provided in juxtaposition with the above-mentioned coater-and-developer, and prints a circuit pattern on a substrate formed with a resist film. With recent decrease in width of lines exposed to light, a lamp for use in printing of a pattern in such an exposure unit is shifting from a conventional ultraviolet light source toward a KrF excimer laser light source and also toward an ArF excimer laser light source. A chemically amplified resist is used when a pattern is printed using a KrF light source and an ArF light source. The chemically amplified resist is a photoresist of the type in which an acid formed by a photochemical reaction during the exposure process acts as a catalyst for resist reactions such as crosslinking, polymerization and the like in the subsequent heat treatment step to change the solubility of the resist in a developing solution, whereby pattern printing is completed.

It is known that, when the chemically amplified resist is used, a slight variation in processing conditions exerts a large influence upon line width uniformity because an extremely small amount of acid catalyst is formed during the exposure process. Thus, an attempt has been made to make various processing conditions throughout the exposure processing step as uniform as possible when the chemically amplified resist is used. A technique for controlling the time interval between the instant of the end of the exposure process and the instant of the start of a post-exposure bake process to be constant to make the line widths of a pattern uniform is proposed, for example, in Japanese Patent Application Laid-Open No. 2002-43208 and Japanese Patent Application Laid-Open No. 2004-342654.

However, slight line width nonuniformity has not yet been eliminated despite various improvements, and is generally considered to result principally from the post-exposure bake process. Like other heating processes, the post-exposure bake process includes the steps of increasing the temperature of a substrate, maintaining the substrate at a predetermined temperature, and then decreasing the temperature of the substrate. Of these steps, the step of increasing the temperature of the substrate and the step of maintaining the substrate at the predetermined temperature can attain in-plane uniformity of the substrate with considerably high accuracy. Despite accurate control over the in-plane uniformity of the substrate during this step, line width nonuniformity still exists. Thus, there is a need in the art for improved methods and systems for performing substrate processing operations including heat treatment operations.

SUMMARY OF THE INVENTION

The present invention is intended in one application for a substrate transport apparatus for transporting a substrate to and from a heat treatment apparatus.

According to an embodiment of the present invention a substrate transport apparatus is provided that includes a transport arm having a holding surface for placing a substrate on the holding surface to hold the substrate, an arm drive element for moving the transport arm, and a reference temperature control element for controlling the temperature of at least the entire holding area of the holding surface at a reference temperature. The holding area of the holding surface is opposed to the substrate. The substrate transport apparatus also includes a corrective temperature control element for controlling the temperature of at least a portion of the holding area at a temperature different from the reference temperature.

Utilizing embodiments of the present invention, provides in the holding area a temperature distribution which cancels out the nonuniformity of a temperature distribution occurring in the heat treatment apparatus to accomplish the uniform heat treatment throughout the heat treatment process step.

The present invention is also intended in another application for a heat treatment apparatus for performing a predetermined heat treatment on a substrate.

According to another embodiment of the present invention, a heat treatment apparatus is provided that includes a substrate transfer part for placing a substrate thereon to transfer the substrate to and from the outside of the apparatus, a heat treatment part for performing the predetermined heat treatment on a substrate, and a transport arm having a holding surface for placing a substrate on the holding surface to hold the substrate. The heat treatment apparatus also includes an arm drive element for moving the transport arm having received an unprocessed substrate in the substrate transfer part to the heat treatment part and for moving the transport arm having received a processed substrate in the heat treatment part to the substrate transfer part and a reference temperature control element for controlling the temperature of at least the entire holding area of the holding surface of the transport arm at a reference temperature. The holding area of the holding surface is opposed to the substrate. The heat treatment apparatus further includes a corrective temperature control element for controlling the temperature of at least a portion of the holding area at a temperature different from the reference temperature.

Utilizing some embodiments produces in the holding area a temperature distribution which cancels out the nonuniformity of a temperature distribution occurring in the heat treatment part to accomplish the uniform heat treatment throughout the heat treatment process step.

In a particular embodiment, the heat treatment apparatus further comprises a temperature controller for causing the corrective temperature control element to control the temperature of the holding area so as to cancel out a temperature distribution produced in a substrate in the heat treatment part.

The present invention is intended in yet another application for a heat treatment apparatus for performing a post-exposure bake process on a substrate with a chemically amplified resist film exposed to light in a pattern.

According to a specific embodiment of the present invention a heat treatment apparatus is provided that includes a substrate transfer part having a holding surface for placing a substrate on the holding surface to transfer the substrate to and from the outside of the apparatus, a heat treatment part for performing the post-exposure bake process on a substrate, and a transport arm for placing a substrate thereon to hold the substrate. The heat treatment apparatus also includes an arm drive element for moving the transport arm having received an unprocessed substrate in the substrate transfer part to the heat treatment part and for moving the transport arm having received a processed substrate in the heat treatment part to the substrate transfer part and a reference temperature control element for controlling the temperature of at least the entire holding area of the holding surface of the substrate transfer part at a reference temperature. The holding area of the holding surface is opposed to the substrate. The heat treatment apparatus further includes a corrective temperature control element for controlling the temperature of at least a portion of the holding area at a temperature different from the reference temperature.

Utilizing some embodiments produces in the holding area a temperature distribution which cancels out the nonuniformity of a temperature distribution occurring in the heat treatment part to accomplish the uniform line width of the pattern in which the resist film is exposed to light.

The present invention is also intended in a particular application for a heat treatment apparatus for heat-treating a substrate by placing the substrate on a holding surface of a heat treatment plate.

According to another specific embodiment of the present invention, a heat treatment apparatus is provided that includes a first temperature control element for controlling the temperature of at least a holding area of the holding surface. The holding area of the holding surface is opposed to the substrate. The heat treatment apparatus also includes a second temperature control element for controlling the temperature of at least a portion of the holding area in addition to the temperature control using the first temperature control element.

A benefit provided by this embodiment is that the second temperature control element corrects the nonuniformity of a temperature distribution occurring in the first temperature control element to accomplish the uniform heat treatment throughout the heat treatment process step.

According to a alternative embodiment, a heat treatment apparatus for heat-treating a substrate by placing the substrate on a holding surface of a heat treatment plate is provided. The heat treatment apparatus includes a first temperature control element configured to control a temperature of at least a holding area of the holding surface. The holding area of the holding surface is opposed to the substrate. The heat treatment apparatus also includes a second temperature control element configured to control the temperature of at least a portion of the holding area in addition to the temperature control using the first temperature control element.

It is therefore an object of the present invention to provide a substrate transport apparatus and a heat treatment apparatus that are capable of performing a uniform heat treatment throughout a heat treatment process step.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a view showing a construction around substrate rest parts in the substrate processing apparatus of FIG. 1;

FIG. 9 is a plan view of a chilled arm in the heating part;

FIG. 10 is a sectional view taken along the line V-V of FIG. 9 and showing an internal structure of the chilled arm;

FIG. 11 shows a temperature history immediately after the post-exposure bake process of a substrate;

FIG. 12 is a sectional view showing an internal structure of the chilled arm according to a second embodiment of the present invention;

FIG. 13 is a view showing a construction of the heating part according to a third embodiment of the present invention.

DETAILED DESCRIPTION OF SPECIFIC EMBODIMENTS

Figure 1:
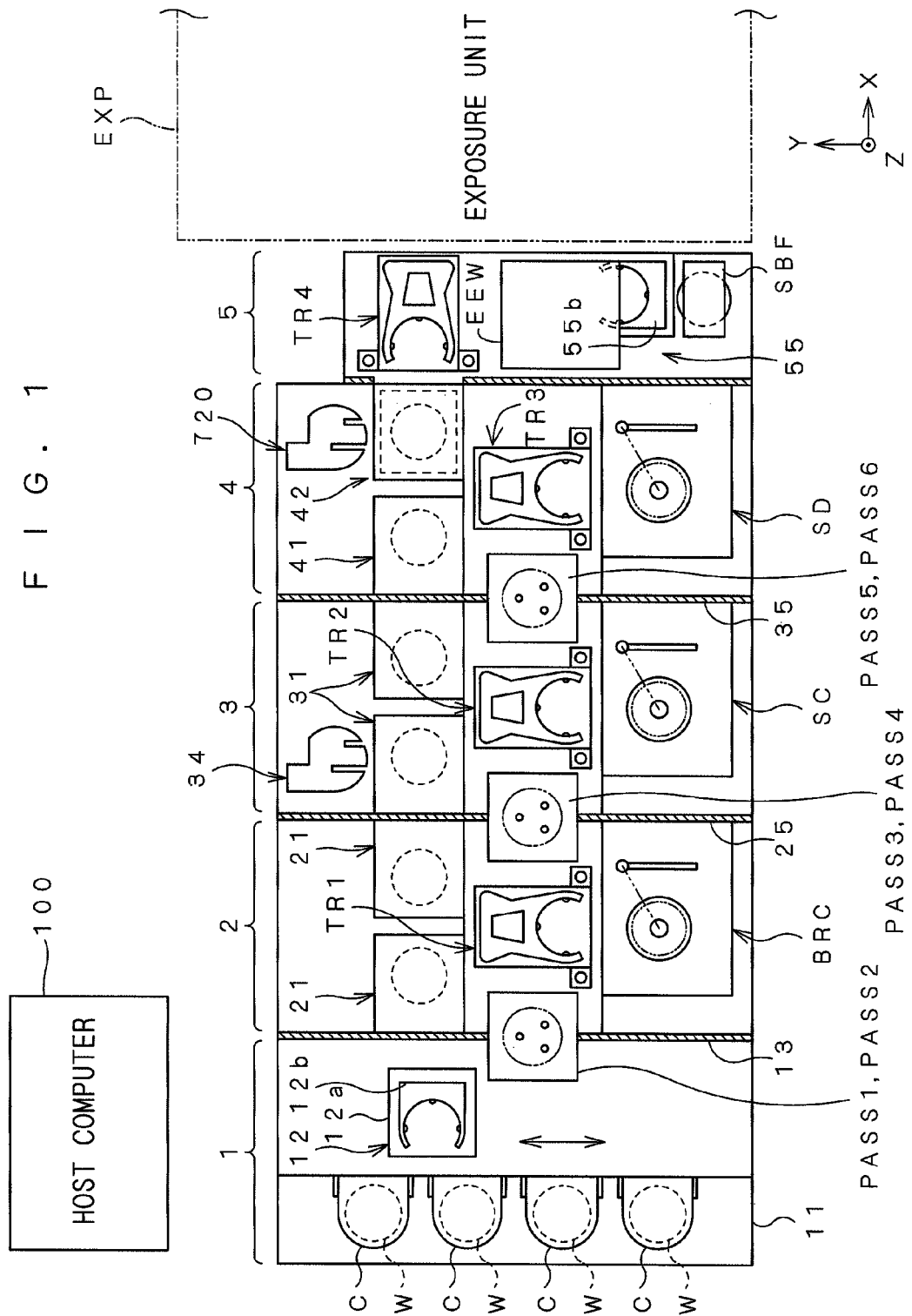
FIG. 1 is a plan view of a substrate processing apparatus with a heat treatment apparatus incorporated therein according to the present invention.
Figure 2:
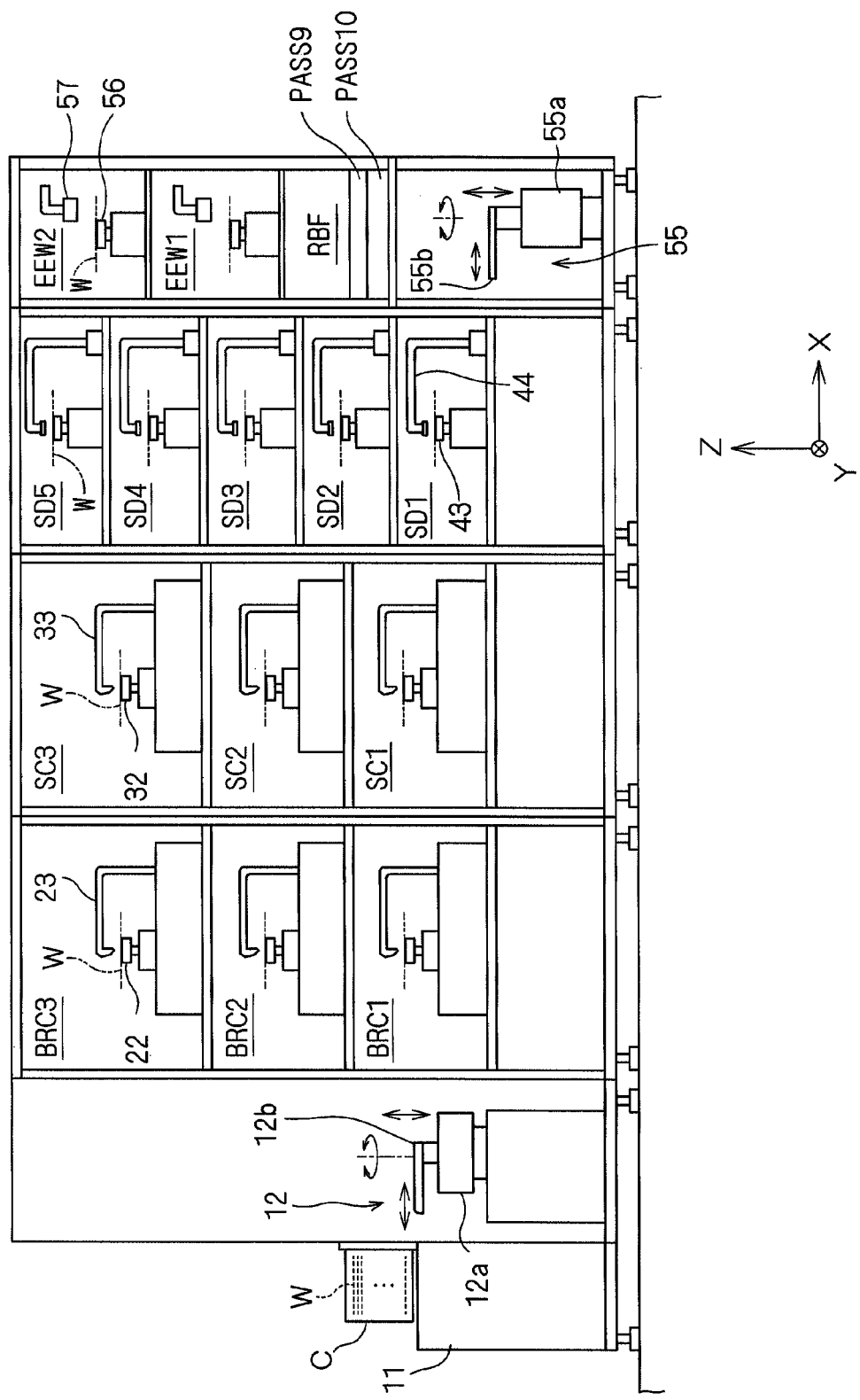
FIG. 2 is a front view of a liquid processing part in the substrate processing apparatus of FIG. 1.
Figure 3:
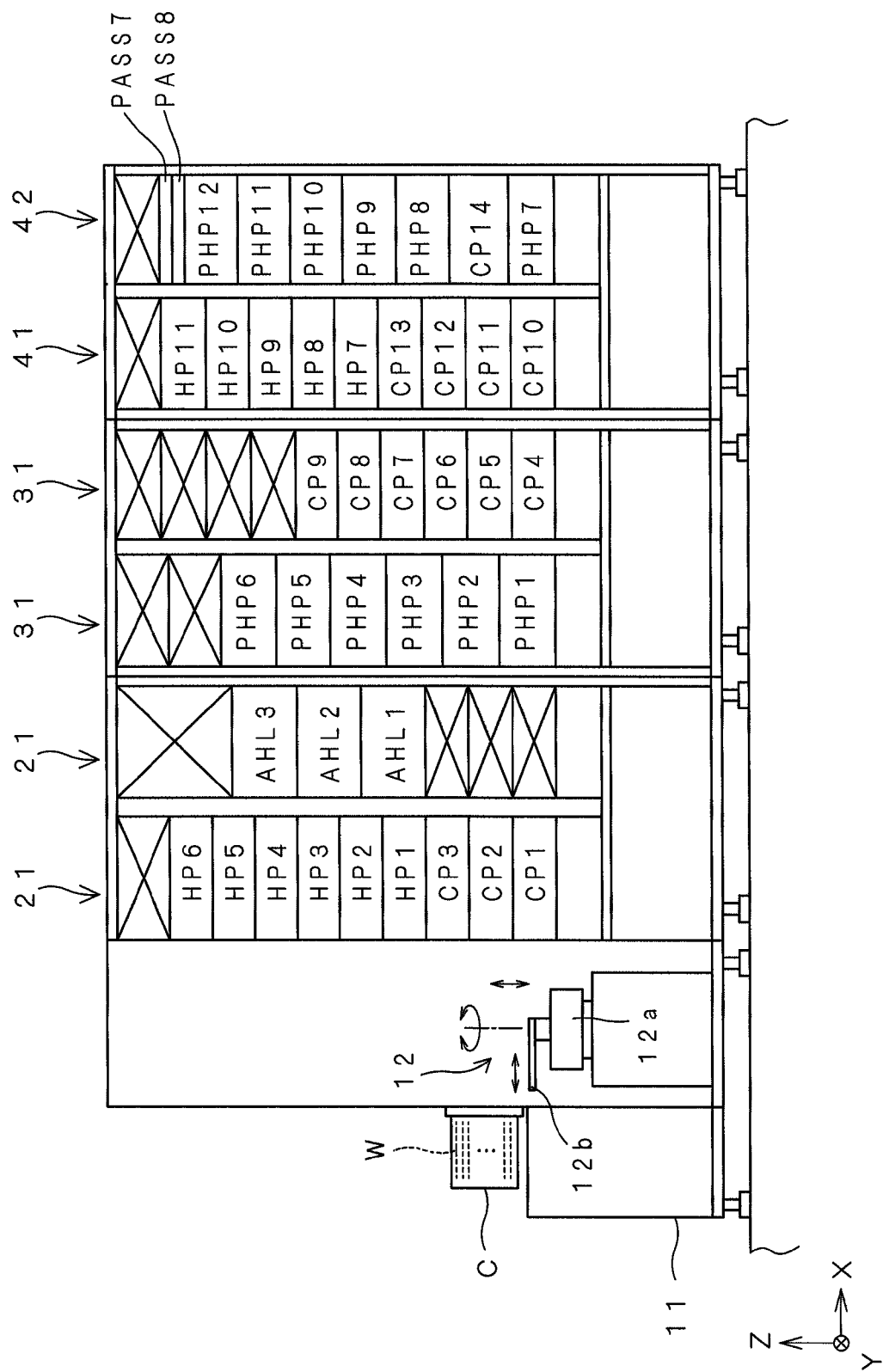
FIG. 3 is a front view of a thermal processing part in the substrate processing apparatus of FIG. 1.

Embodiments according to the present invention will now be described in detail with reference to the drawings. FIG. 1 is a plan view of a substrate processing apparatus with a heat treatment apparatus incorporated therein according to a first embodiment of the present invention. FIG. 2 is a front view of a liquid processing part in the substrate processing apparatus. FIG. 3 is a front view of a thermal processing part in the substrate processing apparatus. FIG. 4 is a view showing a construction around substrate rest parts. An XYZ rectangular coordinate system in which an XY plane is defined as the horizontal plane and a Z axis is defined to extend in the vertical direction is additionally shown in FIG. 1 and the subsequent figures for purposes of clarifying the directional relationship therebetween.

The substrate processing apparatus according to a first embodiment of the present invention is an apparatus (a so-called coater-and-developer) for forming an anti-reflective film and a photoresist film on substrates such as circular semiconductor wafers by coating and for performing a development process on substrates subjected to a pattern exposure process. The substrates to be processed by the substrate processing apparatus according to the present invention are not limited to semiconductor wafers, but may include glass substrates for a liquid crystal display device, and the like.

The substrate processing apparatus according to the first embodiment includes an indexer block 1, a BARC (Bottom Anti-Reflective Coating) block 2, a resist coating block 3, a development processing block 4, and an interface block 5. In the substrate processing apparatus, the five processing blocks 1 to 5 are arranged in side-by-side relation. An exposure unit (or stepper) EXP which is an external apparatus separate from the substrate processing apparatus according to the present invention is provided and connected to the interface block 5. The substrate processing apparatus according to the first embodiment and the exposure unit EXP are connected via LAN lines (not shown) to a host computer 100.

The indexer block 1 is a processing block for transferring unprocessed substrates received from the outside of the substrate processing apparatus outwardly to the BARC block 2 and the resist coating block 3, and for transporting processed substrates received from the development processing block 4 to the outside of the substrate processing apparatus. The indexer block 1 includes a table 11 for placing thereon a plurality of (in this first embodiment, four) cassettes (or carriers) C in juxtaposition, and a substrate transfer mechanism 12 for taking an unprocessed substrate W out of each of the cassettes C and for storing a processed substrate W into each of the cassettes C. The substrate transfer mechanism 12 includes a movable base 12a movable horizontally (in the Y direction) along the table 11, and a holding arm 12b mounted on the movable base 12a and for holding a substrate W in a horizontal position. The holding arm 12b is capable of moving upwardly and downwardly (in the Z direction) over the movable base 12a, pivoting within a horizontal plane and moving back and forth in the direction of the pivot radius. Thus, the substrate transfer mechanism 12 can cause the holding arm 12b to gain access to each of the cassettes C, thereby taking an unprocessed substrate W out of each cassette C and storing a processed substrate W into each cassette C. The cassettes C may be of the following types: an SMIF (standard mechanical interface) pod, and an OC (open cassette) which exposes stored substrates W to the atmosphere, in addition to a FOUP (front opening unified pod) which stores substrates W in an enclosed or sealed space.

The BARC block 2 is provided in adjacent relation to the indexer block 1. A partition 13 for closing off the communication of atmosphere is provided between the indexer block 1 and the BARC block 2. The partition 13 is provided with a pair of vertically arranged substrate rest parts PASS1 and PASS2 each for placing a substrate W thereon for the transfer of the substrate W between the indexer block 1 and the BARC block 2.

The upper substrate rest part PASS1 is used for the transport of a substrate W from the indexer block 1 to the BARC block 2. The substrate rest part PASS1 includes three support pins. The substrate transfer mechanism 12 of the indexer block 1 places an unprocessed substrate W taken out of one of the cassettes C onto the three support pins of the substrate rest part PASS1. A transport robot TR1 of the BARC block 2 to be described later receives the substrate W placed on the substrate rest part PASS1. The lower substrate rest part PASS2, on the other hand, is used for the transport of a substrate W from the BARC block 2 to the indexer block 1. The substrate rest part PASS2 also includes three support pins. The transport robot TR1 of the BARC block 2 places a processed substrate W onto the three support pins of the substrate rest part PASS2. The substrate transfer mechanism 12 receives the substrate W placed on the substrate rest part PASS2 and stores the substrate W into one of the cassettes C. Pairs of substrate rest parts PASS3 to PASS10 to be described later are similar in construction to the pair of substrate rest parts PASS1 and PASS2.

The substrate rest parts PASS1 and PASS2 extend through the partition 13. Each of the substrate rest parts PASS1 and PASS2 includes an optical sensor (not shown) for detecting the presence or absence of a substrate W thereon. Based on a detection signal from each of the sensors, a judgment is made as to whether or not the substrate transfer mechanism 12 and the transport robot TR1 of the BARC block 2 stand ready to transfer and receive a substrate W to and from the substrate rest parts PASS1 and PASS2.

Next, the BARC block 2 will be described. The BARC block 2 is a processing block for forming an anti-reflective film by coating at the bottom of a photoresist film (i.e., as an undercoating film for the photoresist film) to reduce standing waves or halation occurring during exposure. The BARC block 2 includes a bottom coating processor BRC for coating the surface of a substrate W with the anti-reflective film, a pair of heat treatment towers 21 for performing a heat treatment which accompanies the formation of the anti-reflective film by coating, and the transport robot TR1 for transferring and receiving a substrate W to and from the bottom coating processor BRC and the pair of heat treatment towers 21.

In the BARC block 2, the bottom coating processor BRC and the pair of heat treatment towers 21 are arranged on opposite sides of the transport robot TR1. Specifically, the bottom coating processor BRC is on the front side of the substrate processing apparatus, and the pair of heat treatment towers 21 are on the rear side thereof. Additionally, a thermal barrier not shown is provided on the front side of the pair of heat treatment towers 21. Thus, the thermal effect of the pair of heat treatment towers 21 upon the bottom coating processor BRC is avoided by spacing the bottom coating processor BRC apart from the pair of heat treatment towers 21 and by providing the thermal barrier.

As shown in FIG. 2, the bottom coating processor BRC includes three coating processing units BRC1, BRC2 and BRC3 similar in construction to each other and arranged in stacked relation in bottom-to-top order. The three coating processing units BRC1, BRC2 and BRC3 are collectively referred to as the bottom coating processor BRC, unless otherwise identified. Each of the coating processing units BRC1, BRC2 and BRC3 includes a spin chuck 22 for rotating a substrate W in a substantially horizontal plane while holding the substrate W in a substantially horizontal position under suction, a coating nozzle 23 for applying a coating solution for the anti-reflective film onto the substrate W held on the spin chuck 22, a spin motor (not shown) for rotatably driving the spin chuck 22, a cup (not shown) surrounding the substrate W held on the spin chuck 22, and the like.

As shown in FIG. 3, one of the heat treatment towers 21 which is closer to the indexer block 1 includes six hot plates HP1 to HP6 for heating a substrate W up to a predetermined temperature, and cool plates CP1 to CP3 for cooling a heated substrate W down to a predetermined temperature and maintaining the substrate W at the predetermined temperature. The cool plates CP1 to CP3 and the hot plates HP1 to HP6 are arranged in stacked relation in bottom-to-top order in this heat treatment tower 21. The other of the heat treatment towers 21 which is farther from the indexer block 1 includes three adhesion promotion processing parts AHL1 to AHL3 arranged in stacked relation in bottom-to-top order for heat-treating a substrate W in a vapor atmosphere of HMDS (hexamethyl disilazane) to promote the adhesion of the resist film to the substrate W. The locations indicated by the cross marks (x) in FIG. 3 are occupied by a piping and wiring section or reserved as empty space for future addition of processing units.

Thus, stacking the coating processing units BRC1 to BRC3 and the heat treatment units (the hot plates HP1 to HP6, the cool plates CP1 to CP3, and the adhesion promotion processing parts AHL1 to AHL3 in the BARC block 2) in tiers provides smaller space occupied by the substrate processing apparatus to reduce the footprint thereof. The side-by-side arrangement of the pair of heat treatment towers 21 is advantageous in facilitating the maintenance of the heat treatment units and in eliminating the need for extension of ducting and power supply equipment necessary for the heat treatment units to a much higher position.

Figure 5A:
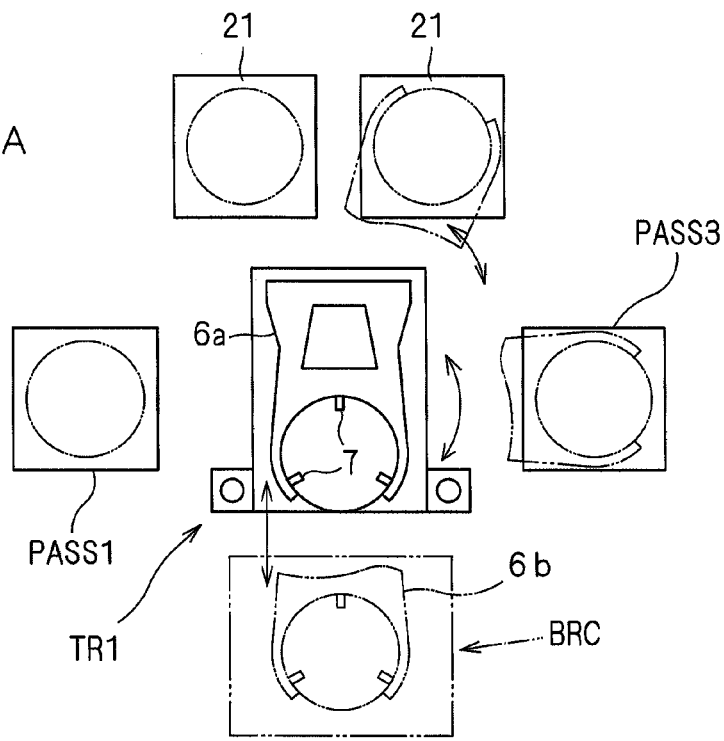
FIG. 5A is a plan view of a transport robot.
Figure 5B:
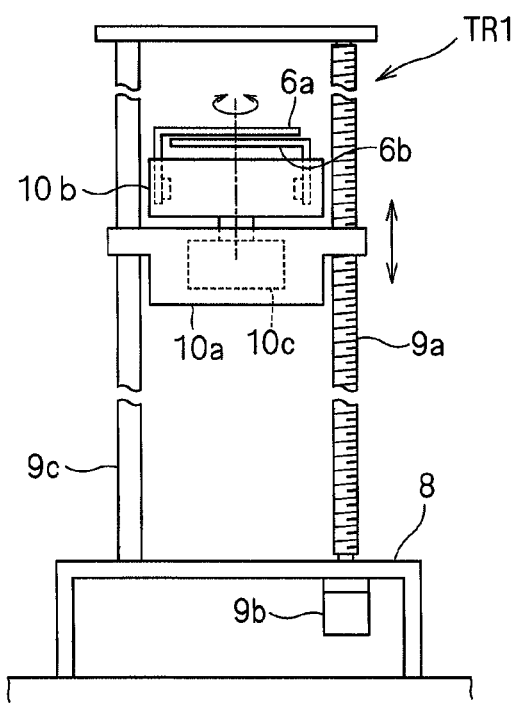
FIG. 5B is a front view of the transport robot.

FIGS. 5A and 5B are views for illustrating the transport robot TR1. FIG. 5A is a plan view of the transport robot TR1, and FIG. 5B is a front view of the transport robot TR1. The transport robot TR1 includes a pair of (upper and lower) holding arms 6a and 6b in proximity to each other for holding a substrate W in a substantially horizontal position. Each of the holding arms 6a and 6b includes a distal end portion of a substantially C-shaped plan configuration, and a plurality of pins 7 projecting inwardly from the inside of the substantially C-shaped distal end portion for supporting the peripheral edge of a substrate W from below.

The transport robot TR1 further includes a base 8 fixedly mounted on an apparatus base (or an apparatus frame). A guide shaft 9c is mounted upright on the base 8, and a threaded shaft 9a is rotatably mounted and supported upright on the base 8. A motor 9b for rotatably driving the threaded shaft 9a is fixedly mounted to the base 8. A lift 10a is in threaded engagement with the threaded shaft 9a, and is freely slidable relative to the guide shaft 9c. With such an arrangement, the motor 9b rotatably drives the threaded shaft 9a, whereby the lift 10a is guided by the guide shaft 9c to move up and down in a vertical direction (in the Z direction).

An arm base 10b is mounted on the lift 10a pivotably about a vertical axis. The lift 10a contains a motor 10c for pivotably driving the arm base 10b. The pair of (upper and lower) holding arms 6a and 6b described above are provided on the arm base 10b. Each of the holding arms 6a and 6b is independently movable back and forth in a horizontal direction (in the direction of the pivot radius of the arm base 10b) by a sliding drive mechanism (not shown) mounted to the arm base 10b.

With such an arrangement, the transport robot TR1 is capable of causing each of the pair of holding arms 6a and 6b to independently gain access to the substrate rest parts PASS1 and PASS2, the heat treatment units provided in the heat treatment towers 21, the coating processing units provided in the bottom coating processor BRC, and the substrate rest parts PASS3 and PASS4 to be described later, thereby transferring and receiving substrates W to and from the above-mentioned parts and units, as shown in FIG. 5A.

Next, the resist coating block 3 will be described. The resist coating block 3 is provided so as to be sandwiched between the BARC block 2 and the development processing block 4. A partition 25 for closing off the communication of atmosphere is also provided between the resist coating block 3 and the BARC block 2. The partition 25 is provided with the pair of vertically arranged substrate rest parts PASS3 and PASS4 each for placing a substrate W thereon for the transfer of the substrate W between the BARC block 2 and the resist coating block 3. The substrate rest parts PASS3 and PASS4 are similar in construction to the above-mentioned substrate rest parts PASS1 and PASS2.

The upper substrate rest part PASS3 is used for the transport of a substrate W from the BARC block 2 to the resist coating block 3. Specifically, a transport robot TR2 of the resist coating block 3 receives the substrate W placed on the substrate rest part PASS3 by the transport robot TR1 of the BARC block 2. The lower substrate rest part PASS4, on the other hand, is used for the transport of a substrate W from the resist coating block 3 to the BARC block 2. Specifically, the transport robot TR1 of the BARC block 2 receives the substrate W placed on the substrate rest part PASS4 by the transport robot TR2 of the resist coating block 3.

The substrate rest parts PASS3 and PASS4 extend through the partition 25. Each of the substrate rest parts PASS3 and PASS4 includes an optical sensor (not shown) for detecting the presence or absence of a substrate W thereon. Based on a detection signal from each of the sensors, a judgment is made as to whether or not the transport robots TR1 and TR2 stand ready to transfer and receive a substrate W to and from the substrate rest parts PASS3 and PASS4. A pair of (upper and lower) cool plates WCP of a water-cooled type for roughly cooling a substrate W are provided under the substrate rest parts PASS3 and PASS4, and extend through the partition 25.

The resist coating block 3 is a processing block for applying a resist onto a substrate W coated with the anti-reflective film by the BARC block 2 to form a resist film. In this first embodiment, a chemically amplified resist is used as the photoresist. The resist coating block 3 includes a resist coating processor SC for applying the resist onto the anti-reflective film serving as the undercoating film, a pair of heat treatment towers 31 for performing a heat treatment which accompanies the resist coating process, and the transport robot TR2 for transferring and receiving a substrate W to and from the resist coating processor SC and the pair of heat treatment towers 31.

In the resist coating block 3, the resist coating processor SC and the pair of heat treatment towers 31 are arranged on opposite sides of the transport robot TR2. Specifically, the resist coating processor SC is on the front side of the substrate processing apparatus, and the pair of heat treatment towers 31 are on the rear side thereof. Additionally, a thermal barrier not shown is provided on the front side of the pair of heat treatment towers 31. Thus, the thermal effect of the pair of heat treatment towers 31 upon the resist coating processor SC is avoided by spacing the resist coating processor SC apart from the pair of heat treatment towers 31 and by providing the thermal barrier.

As shown in FIG. 2, the resist coating processor SC includes three coating processing units SC1, SC2 and SC3 similar in construction to each other and arranged in stacked relation in bottom-to-top order. The three coating processing units SC1, SC2 and SC3 are collectively referred to as the resist coating processor SC, unless otherwise identified. Each of the coating processing units SC1, SC2 and SC3 includes a spin chuck 32 for rotating a substrate W in a substantially horizontal plane while holding the substrate W in a substantially horizontal position under suction, a coating nozzle 33 for applying a resist solution onto the substrate W held on the spin chuck 32, a spin motor (not shown) for rotatably driving the spin chuck 32, a cup (not shown) surrounding the substrate W held on the spin chuck 32, and the like.

As shown in FIG. 3, one of the heat treatment towers 31 which is closer to the indexer block 1 includes six heating parts PHP1 to PHP6 arranged in stacked relation in bottom-to-top order for heating a substrate W up to a predetermined temperature. The other of the heat treatment towers 31 which is farther from the indexer block 1 includes cool plates CP4 to CP9 arranged in stacked relation in bottom-to-top order for cooling a heated substrate W down to a predetermined temperature and maintaining the substrate W at the predetermined temperature.

Each of the heating parts PHP1 to PHP6 is a heat treatment unit including, in addition to an ordinary hot plate for heating a substrate W placed thereon, a temporary substrate rest part for placing a substrate W in an upper position spaced apart from the hot plate, and a local transport mechanism 34 (See FIG. 1) for transporting a substrate W between the hot plate and the temporary substrate rest part. The local transport mechanism 34 is capable of moving up and down and moving back and forth, and includes a mechanism for cooling down a substrate W being transported by circulating cooling water therein.

The local transport mechanism 34 is provided on the opposite side of the above-mentioned hot plate and the temporary substrate rest part from the transport robot TR2, that is, on the rear side of the substrate processing apparatus. The temporary substrate rest part has both an open side facing the transport robot TR2 and an open side facing the local transport mechanism 34. The hot plate, on the other hand, has only an open side facing the local transport mechanism 34, and a closed side facing the transport robot TR2. Thus, both of the transport robot TR2 and the local transport mechanism 34 can gain access to the temporary substrate rest part, but only the local transport mechanism 34 can gain access to the hot plate.

A substrate W is transported into each of the above-mentioned heating parts PHP1 to PHP6 having such a construction in a manner to be described below. First, the transport robot TR2 places a substrate W onto the temporary substrate rest part. Subsequently, the local transport mechanism 34 receives the substrate W from the temporary substrate rest part to transport the substrate W to the hot plate. The hot plate performs a heating process on the substrate W. The local transport mechanism 34 takes out the substrate W subjected to the heating process by the hot plate, and transports the substrate W to the temporary substrate rest part. During the transport, the substrate W is cooled down by the cooling function of the local transport mechanism 34. Thereafter, the transport robot TR2 takes out the substrate W subjected to the heating process and transported to the temporary substrate rest part.

In this manner, the transport robot TR2 transfers and receives the substrate W to and from only the temporary substrate rest part held at room temperature in each of the heating parts PHP1 to PHP6, but does not transfer and receive the substrate W directly to and from the hot plate. This avoids the temperature rise of the transport robot TR2. The hot plate having only the open side facing the local transport mechanism 34 prevents the heat atmosphere leaking out of the hot plate from affecting the transport robot TR2 and the resist coating processor SC. The transport robot TR2 transfers and receives a substrate W directly to and from the cool plates CP4 to CP9.

The transport robot TR2 is precisely identical in construction with the transport robot TR1. Thus, the transport robot TR2 is capable of causing each of a pair of holding arms thereof to independently gain access to the substrate rest parts PASS3 and PASS4, the heat treatment units provided in the heat treatment towers 31, the coating processing units provided in the resist coating processor SC, and the substrate rest parts PASS5 and PASS6 to be described later, thereby transferring and receiving substrates W to and from the above-mentioned parts and units.

Next, the development processing block 4 will be described. The development processing block 4 is provided so as to be sandwiched between the resist coating block 3 and the interface block 5. A partition 35 for closing off the communication of atmosphere is also provided between the resist coating block 3 and the development processing block 4. The partition 35 is provided with the pair of vertically arranged substrate rest parts PASS5 and PASS6 each for placing a substrate W thereon for the transfer of the substrate W between the resist coating block 3 and the development processing block 4. The substrate rest parts PASS5 and PASS6 are similar in construction to the above-mentioned substrate rest parts PASS1 and PASS2.

The upper substrate rest part PASS5 is used for the transport of a substrate W from the resist coating block 3 to the development processing block 4. Specifically, a transport robot TR3 of the development processing block 4 receives the substrate W placed on the substrate rest part PASS5 by the transport robot TR2 of the resist coating block 3. The lower substrate rest part PASS6, on the other hand, is used for the transport of a substrate W from the development processing block 4 to the resist coating block 3. Specifically, the transport robot TR2 of the resist coating block 3 receives the substrate W placed on the substrate rest part PASS6 by the transport robot TR3 of the development processing block 4.

The substrate rest parts PASS5 and PASS6 extend through the partition 35. Each of the substrate rest parts PASS5 and PASS6 includes an optical sensor (not shown) for detecting the presence or absence of a substrate W thereon. Based on a detection signal from each of the sensors, a judgment is made as to whether or not the transport robots TR2 and TR3 stand ready to transfer and receive a substrate W to and from the substrate rest parts PASS5 and PASS6. A pair of (upper and lower) cool plates WCP of a water-cooled type for roughly cooling a substrate W are provided under the substrate rest parts PASS5 and PASS6, and extend through the partition 35.

The development processing block 4 is a processing block for performing a development process on a substrate W subjected to an exposure process. The development processing block 4 includes a development processor SD for applying a developing solution onto a substrate W exposed in a pattern to perform the development process, a pair of heat treatment towers 41 and 42 for performing a heat treatment which accompanies the development process, and the transport robot TR3 for transferring and receiving a substrate W to and from the development processor SD and the pair of heat treatment towers 41 and 42. The transport robot TR3 is precisely identical in construction with the above-mentioned transport robots TR1 and TR2.

As shown in FIG. 2, the development processor SD includes five development processing units SD1, SD2, SD3, SD4 and SD5 similar in construction to each other and arranged in stacked relation in bottom-to-top order. The five development processing units SD1 to SD5 are collectively referred to as the development processor SD, unless otherwise identified. Each of the development processing units SD1 to SD5 includes a spin chuck 43 for rotating a substrate W in a substantially horizontal plane while holding the substrate W in a substantially horizontal position under suction, a nozzle 44 for applying the developing solution onto the substrate W held on the spin chuck 43, a spin motor (not shown) for rotatably driving the spin chuck 43, a cup (not shown) surrounding the substrate W held on the spin chuck 43, and the like.

As shown in FIG. 3, the heat treatment tower 41 which is closer to the indexer block 1 includes five hot plates HP7 to HP11 for heating a substrate W up to a predetermined temperature, and cool plates CP10 to CP13 for cooling a heated substrate W down to a predetermined temperature and for maintaining the substrate W at the predetermined temperature. The cool plates CP10 to CP13 and the hot plates HP7 to HP11 are arranged in stacked relation in bottom-to-top order in this heat treatment tower 41.

Figure 7:
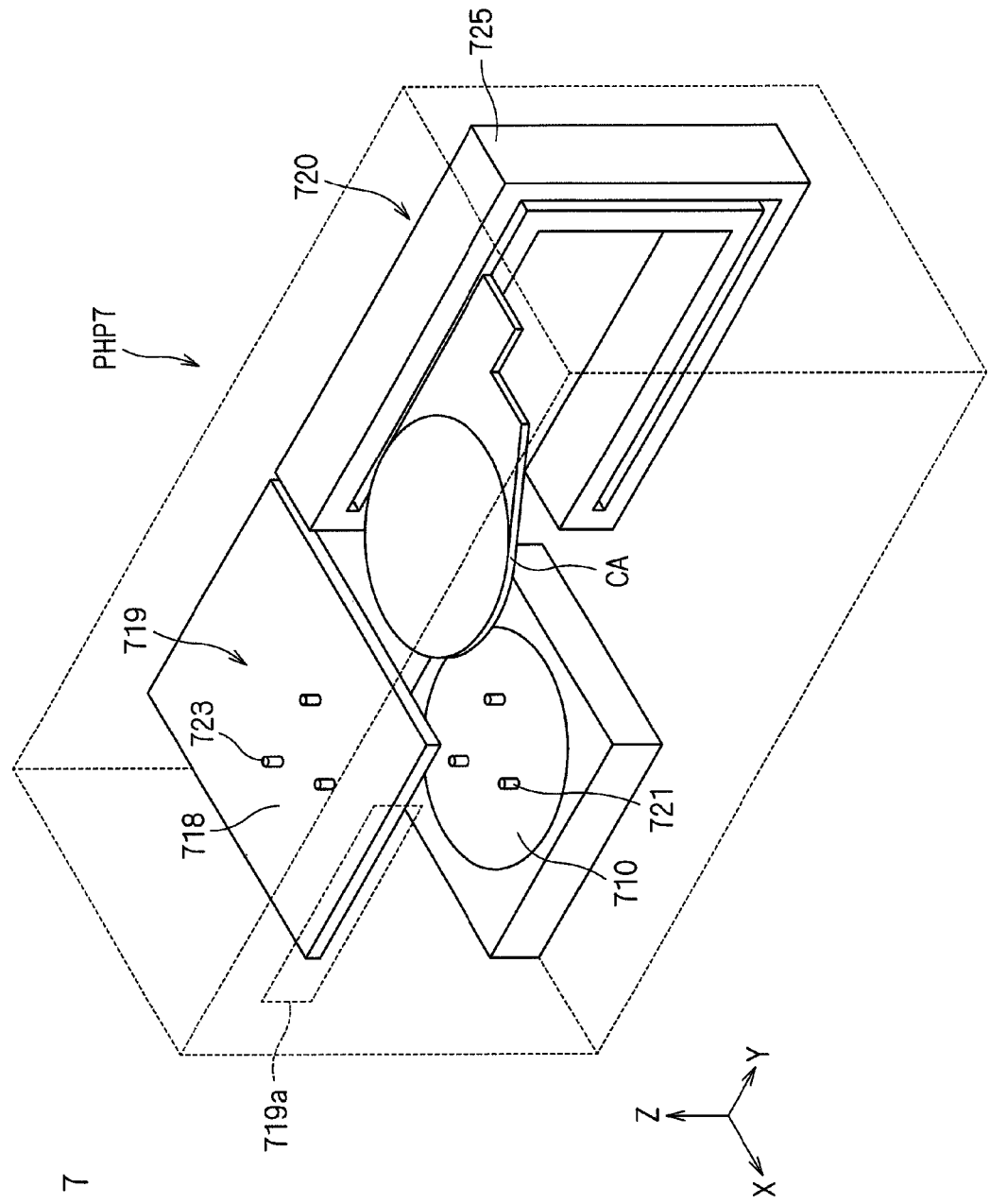
FIG. 7 is a perspective view of a heating part serving as the heat treatment apparatus according to the present invention.
Figure 8A:
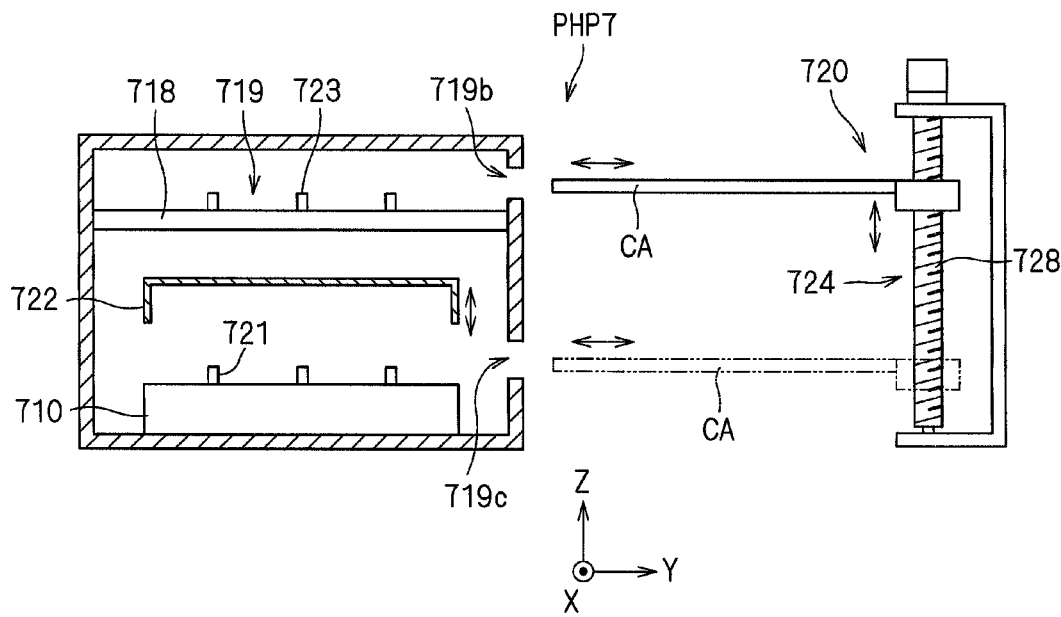
FIG. 8A is a side sectional view of the heating part with a temporary substrate rest part.
Figure 8B:
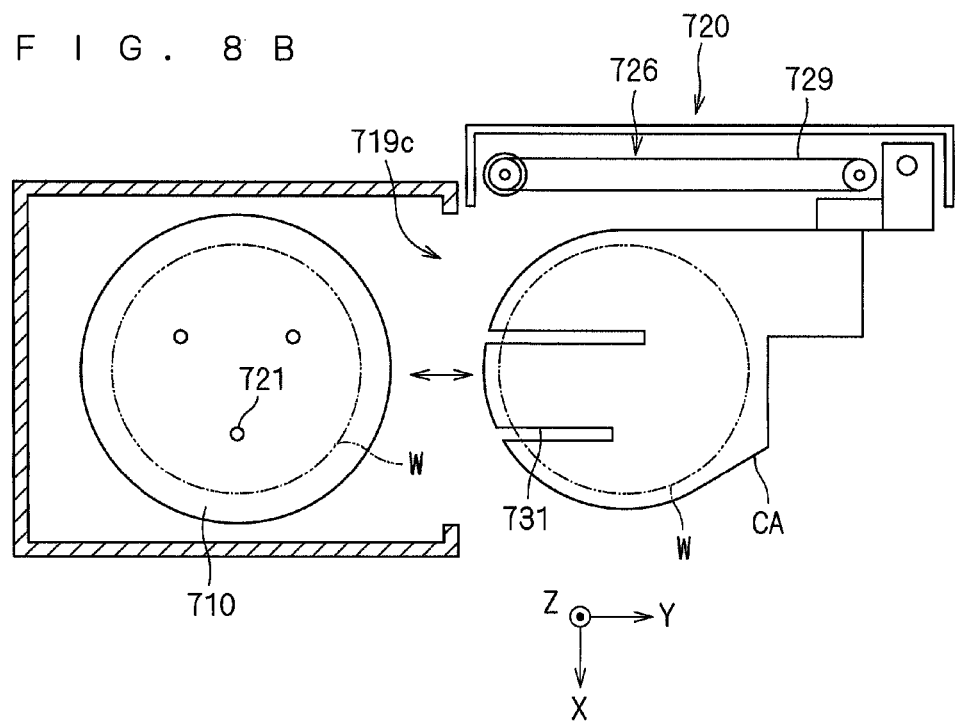
FIG. 8B is a plan view of the heating part with the temporary substrate rest part.

The heat treatment tower 42 which is farther from the indexer block 1, on the other hand, includes the six heating parts PHP7 to PHP12 and a cool plate CP14 which are arranged in stacked relation. FIG. 7 is a perspective view of the heating part PHP7 serving as the heat treatment apparatus according to the present invention. FIGS. 8A and 8B schematically show the construction of the heating part PHP7. FIG. 8A is a side sectional view of the heating part PHP7, and FIG. 8B is a plan view of the heating part PHP7. Although the heating part PHP7 is illustrated in FIGS. 7, 8A and 8B, the heating parts PHP8 to PHP12 are precisely identical in construction with the heating part PHP7. The heating part PHP7 includes a heating plate 710 for performing a heating process on a substrate W placed thereon, a temporary substrate rest part 719 for placing a substrate W in an upper or lower position (in this first embodiment, an upper position) spaced apart from the heating plate 710, and a local transport mechanism 720 specific to a heat treatment part for transporting a substrate W between the heating plate 710 and the temporary substrate rest part 719.

The heating plate 710 places a substrate W on an upper surface thereof to perform a heating process on the substrate W. Various known mechanisms including, for example, a mica heater, a heat pipe structure and the like may be used as a heating mechanism of the heating plate 710. The heating plate 710 is provided with a plurality of (in this first embodiment, three) movable support pins 721 extendable out of and retractable into the plate surface. A vertically movable top cover 722 for covering a substrate W during the heating process is provided over the heating plate 710.

The temporary substrate rest part 719 functions as a substrate transfer part which temporarily places a substrate W thereon for the transfer of the substrate W to and from the outside of the heating part PHP7. Specifically, both a substrate W before the heating process which is to be transported into the heating part PHP7 and a substrate W after the heating process which is to be transported out of the heating part PHP7 pass through the temporary substrate rest part 719. The temporary substrate rest part 719 includes a plurality of (in this first embodiment, three) fixed support pins 723 mounted upright on an upper surface of a floor plate 718 and for supporting a substrate W. The floor plate 718 also functions as a partition wall between the heating plate 710 and the temporary substrate rest part 719.

The local transport mechanism 720 includes a chilled arm CA which places a substrate W on a holding surface thereof to hold the substrate W in a horizontal position, and an arm driver 725 for moving the chilled arm CA between the temporary substrate rest part 719 and the heating plate 710. The arm driver 725 includes a vertical drive mechanism 724 for moving the chilled arm CA up and down in a vertical direction, and a sliding drive mechanism 726 for moving the chilled arm CA back and forth in a horizontal direction. The vertical drive mechanism 724 includes a screw feed mechanism for moving the chilled arm CA up and down by rotating a ball screw 728. The sliding drive mechanism 726 includes a belt drive mechanism for horizontally moving the chilled arm CA by using a belt 729 running around a pair of pulleys disposed in a horizontal direction. The drive mechanisms constituting the arm driver 725 are not limited to the screw feed mechanism and the belt drive mechanism, but may employ various known drive mechanisms such as an air cylinder, a linear motor and the like.

FIG. 9 is a plan view of the chilled arm CA. FIG. 10 is a sectional view taken along the line V-V of FIG. 9 and showing an internal structure of the chilled arm CA. The chilled arm CA is formed with a member of a flat configuration greater than the size of the substrate W in plan view (in this first embodiment, a circular configuration having a diameter of 300 mm). The chilled arm CA is formed with a pair of slits 731 so as not to interfere with the movable support pins 721 and the fixed support pins 723 when the chilled arm CA moves to over the heating plate 710 and moves into the temporary substrate rest part 719. Specifically, the movable support pins 721 in a raised position enter the slits 731 when the chilled arm CA moves to over the heating plate 710, and the fixed support pins 723 enter the slits 731 when the chilled arm CA moves into the temporary substrate rest part 719.

The local transport mechanism 720 further includes a pair of temperature control mechanisms for controlling the temperature of the holding surface of the chilled arm CA. A first temperature control mechanism is a water-cooling mechanism which circulates cooling water inside the chilled arm CA to control the temperature of substantially the entire holding area EA of the holding surface which is opposed to the substrate W held thereon at a predetermined temperature. Specifically, a meandering flow passage pipe 732 is provided inside the chilled arm CA. The flow passage pipe 732 is disposed in opposed relation to at least the entire holding area EA. Cooling water supplied from a cooling water supply part 733 circulates through the flow passage pipe 732 to cool and maintain the holding area EA at a temperature of approximately 20° C. A utility supply source provided in the substrate processing apparatus may be used as the cooling water supply part 733.

A second temperature control mechanism is a heating mechanism which controls the temperature of at least a portion of the holding area EA at a temperature different from the above-mentioned predetermined temperature. The second temperature control mechanism is provided to partially correct the temperature control performed by the first temperature control mechanism. Specifically, in this first embodiment, the second temperature control mechanism includes six polyimide heaters affixed to the holding area EA of the holding surface of the chilled arm CA. Each of the polyimide heaters is a film heater including metallic foil sandwiched between a pair of polyimide films. As shown in FIG. 9, a disk-shaped polyimide heater 741 is affixed to a central portion of the holding area EA, and an annular polyimide heater 742 is affixed around the polyimide heater 741 in concentric relation with the polyimide heater 741. Four polyimide heaters 743, 744, 745 and 746 are affixed to four regions into which an annular region surrounding the polyimide heater 742 is circumferentially equally divided. Slight gaps are formed between the six polyimide heaters 741 to 746 to prevent thermal interference with each other.

The six polyimide heaters 741 to 746 are connected to a temperature controller 740 independently of each other. Each of the polyimide heaters 741 to 746 is provided with a temperature sensor 748 which uses a thermocouple or other temperature measuring device to measure the temperature of each polyimide heater. The six temperature sensors 748 are also connected to the temperature controller 740. Based on the temperature detection results from the respective temperature sensors 748, the temperature controller 740 controls the amount of power supply to the polyimide heaters 741 to 746 so that the six polyimide heaters 741 to 746 reach previously set predetermined temperatures, respectively. The temperature control of the polyimide heaters 741 to 746 by the temperature controller 740 is PID (Proportional, Integral, Derivative) control. That is, the temperature controller 740 individually controls the temperatures of the respective six polyimide heaters 741 to 746 independently of each other, and maintains the temperatures of the six polyimide heaters 741 to 746 at previously set predetermined target temperatures, respectively. Although six polyimide heaters are illustrated in FIG. 9, other numbers of heaters, other spatial arrangements, and different heater materials are included within the scope of embodiments of the present invention. One of ordinary skill in the art would recognize many variations, modifications, and alternatives.

The provision of such two temperature control mechanisms allows the temperature control of the entire holding area EA at a predetermined reference temperature (in this first embodiment, approximately 20° C.) by the use of the cooling water circulation in the chilled arm CA, and the temperature control of the regions of the holding area EA to which the six polyimide heaters 741 to 746 are affixed at temperatures different from the above-mentioned reference temperature by the use of the polyimide heaters 741 to 746. In this first embodiment, the temperature of the holding area EA is partially or entirely increased up to a maximum temperature of 80° C. by the polyimide heaters 741 to 746. A plurality of (in this first embodiment, nine) support pins 727 are mounted upright in the holding area EA of the chilled arm CA. The upper ends of the support pins 727 protrude slightly upwardly from the upper surfaces of the polyimide heaters 741 to 746 in the form of a film.

Embodiments of the present invention are useful in performing the step of decreasing the temperature of the substrate in the post-exposure bake process, which is principally intended for the termination of the chemical reaction of the resist. Thus, embodiments of the present invention provides solutions for increasing in-plane uniformity during decreasing temperature ramp portions of post-exposure bake, thereby decreasing line width nonuniformity resulting from in-plane nonuniformity. That is, problems associated with line width nonuniformity are reduced or solved by embodiments of the present invention, which provide for uniform heat treatment throughout the heat treatment process steps.

The above-mentioned local transport mechanism 720 is provided at the rear of (i.e., on the (+Y) side relative to) the heating plate 710 and the temporary substrate rest part 719 in the apparatus. A transport robot TR4 of the interface block 5 is disposed on the (+X) side relative to the heating plate 710 and the temporary substrate rest part 719, and the transport robot TR3 of the development processing block 4 is disposed on the (−Y) side relative to the heating plate 710 and the temporary substrate rest part 719. In an upper portion of an enclosure covering the heating plate 710 and the temporary substrate rest part 719, i.e., a portion of the enclosure which covers the temporary substrate rest part 719, an opening 719a for allowing the transport robot TR4 to enter the temporary substrate rest part 719 is provided on the (+X) side thereof (See FIG. 7), and an opening 719b for allowing the chilled arm CA to enter the temporary substrate rest part 719 is provided on the (+Y) side thereof (See FIG. 8A). In a lower portion of the enclosure, i.e., a portion of the enclosure which covers the heating plate 710, the (+X) and (−Y) sides thereof (i.e., the surfaces of the enclosure 727 facing the transport robot TR3 and the transport robot TR4) are provided with no openings, and an opening 719c for allowing the chilled arm CA to move to over the heating plate 710 is provided on the (+Y) side thereof.

A substrate W is carried into and out of the above-mentioned heating part PHP7 in a manner to be described below. First, the transport robot TR4 of the interface block 5 holds an exposed substrate W, and places the substrate W onto the fixed support pins 723 of the temporary substrate rest part 719. Subsequently, the chilled arm CA of the local transport mechanism 720 moves to under the substrate W, and then moves slightly upwardly to receive the substrate W from the fixed support pins 723. At this time, the substrate W is supported from below by the plurality of support pins 727 of the chilled arm CA.

The chilled arm CA which holds the substrate W moves backwardly out of the temporary substrate rest part 719, and moves downwardly to a position opposed to the heating plate 710. At this time, the movable support pins 721 of the heating plate 710 are in a lowered position, and the top cover 722 is in a raised position. The chilled arm CA, which holds the substrate W, moves to a position over the heating plate 710. After the movable support pins 721 move upwardly and receive the substrate W in a receiving position, the chilled arm CA moves backwardly from the heating plate 710. Subsequently, the movable support pins 721 move downwardly to place the substrate W onto the heating plate 710, and the top cover 722 moves downwardly to cover the substrate W. In this state, the substrate W is subjected to the heating process. After the heating process, the top cover 722 moves upwardly, and the movable support pins 721 move upwardly to lift the substrate W. Next, after the chilled arm CA moves to under the substrate W, the movable support pins 721 move downwardly to transfer the substrate W to the chilled arm CA. The chilled arm CA which receives the substrate W from the movable support pins 721 and holds the substrate W moves backwardly from the heating plate 710, and then moves upwardly to transport the substrate W to the temporary substrate rest part 719. In the course of the transport, the substrate W held by chilled arm CA is subjected to the temperature control, the details of which will be described later. The chilled arm CA brings the substrate W subjected to the temperature control onto the fixed support pins 723 of the temporary substrate rest part 719. The transport robot TR4 takes out and transports the substrate W.

The transport robot TR4 transfers and receives the substrate W to and from only the temporary substrate rest part 719, but does not transfer and receive the substrate W to and from the heating plate 710. This avoids the temperature rise of the transport robot TR4. Additionally, the opening 719c through which the substrate W is placed onto and removed from the heating plate 710 is formed only on the side of the local transport mechanism 720. This prevents the heat atmosphere leaking out through the opening 719c from raising the temperatures of the transport robot TR3 and the transport robot TR4 and also from affecting the development processor SD.

As described above, the transport robot TR4 of the interface block 5 can gain access to the heating parts PHP7 to PHP12 and the cool plate CP14, but the transport robot TR3 of the development processing block 4 cannot gain access thereto. The transport robot TR3 of the development processing block 4 gains access to the heat treatment units incorporated in the heat treatment tower 41.

The pair of vertically arranged substrate rest parts PASS7 and PASS8 in proximity to each other for the transfer of a substrate W between the development processing block 4 and the interface block 5 adjacent thereto are incorporated in the topmost tier of the heat treatment tower 42. The upper substrate rest part PASS7 is used for the transport of a substrate W from the development processing block 4 to the interface block 5. Specifically, the transport robot TR4 of the interface block 5 receives the substrate W placed on the substrate rest part PASS7 by the transport robot TR3 of the development processing block 4. The lower substrate rest part PASS8, on the other hand, is used for the transport of a substrate W from the interface block 5 to the development processing block 4. Specifically, the transport robot TR3 of the development processing block 4 receives the substrate W placed on the substrate rest part PASS8 by the transport robot TR4 of the interface block 5. Each of the substrate rest parts PASS7 and PASS8 includes both an open side facing the transport robot TR3 of the development processing block 4 and an open side facing the transport robot TR4 of the interface block 5.

Next, the interface block 5 will be described. The interface block 5 is a block provided adjacent to the development processing block 4. The interface block 5 receives a substrate W with the resist film formed thereon by the resist coating process from the resist coating block 3 to transfer the substrate W to the exposure unit EXP which is an external apparatus separate from the substrate processing apparatus according to the present invention. Also, the interface block 5 receives an exposed substrate W from the exposure unit EXP to transfer the exposed substrate W to the development processing block 4. The interface block 5 in this first embodiment includes a transport mechanism 55 for transferring and receiving a substrate W to and from the exposure unit EXP, a pair of edge exposure units EEW1 and EEW2 for exposing the periphery of a substrate W formed with the resist film, and the transport robot TR4 for transferring and receiving a substrate W to and from the heating parts PHP7 to PHP12 and cool plate CP14 provided in the development processing block 4 and the edge exposure units EEW1 and EEW2.

As shown in FIG. 2, each of the edge exposure units EEW1 and EEW2 (collectively referred to as an edge exposure part EEW, unless otherwise identified) includes a spin chuck 56 for rotating a substrate W in a substantially horizontal plane while holding the substrate W in a substantially horizontal position under suction, a light irradiator 57 for exposing the periphery of the substrate W held on the spin chuck 56 to light, and the like. The pair of edge exposure units EEW1 and EEW2 are arranged in vertically stacked relation in the center of the interface block 5. The transport robot TR4 provided adjacent to the edge exposure part EEW and the heat treatment tower 42 of the development processing block 4 is similar in construction to the above-mentioned transport robots TR1 to TR3.

With reference to FIG. 2, a return buffer RBF for the return of substrates W is provided under the pair of edge exposure units EEW1 and EEW2, and the pair of vertically arranged substrate rest parts PASS9 and PASS10 are provided under the return buffer RBF. The return buffer RBF is provided to temporarily store a substrate W subjected to a post-exposure bake process in the heating parts PHP7 to PHP12 of the development processing block 4 if the development processing block 4 is unable to perform the development process on the substrate W because of some sort of malfunction and the like. The return buffer RBF includes a cabinet capable of storing a plurality of substrates W in tiers. The upper substrate rest part PASS9 is used for the transfer of a substrate W from the transport robot TR4 to the transport mechanism 55. The lower substrate rest part PASS10 is used for the transfer of a substrate W from the transport mechanism 55 to the transport robot TR4. The transport robot TR4 gains access to the return buffer RBF.

As shown in FIG. 2, the transport mechanism 55 includes a movable base 55a movable horizontally in the Y direction, and a holding arm 55b mounted on the movable base 55a and for holding a substrate W. The holding arm 55b is capable of moving up and down, pivoting and moving back and forth in the direction of the pivot radius relative to the movable base 55a. With such an arrangement, the transport mechanism 55 transfers and receives a substrate W to and from the exposure unit EXP, transfers and receives a substrate W to and from the substrate rest parts PASS9 and PASS10, and stores and takes a substrate W into and out of a send buffer SBF for the sending of substrates W. The send buffer SBF is provided to temporarily store a substrate W prior to the exposure process if the exposure unit EXP is unable to accept the substrate W, and includes a cabinet capable of storing a plurality of substrates W in tiers.

A downflow of clean air is always supplied into the indexer block 1, the BARC block 2, the resist coating block 3, the development processing block 4, and the interface block 5 described above to thereby avoid the adverse effects of raised particles and gas flows upon the processes in the respective blocks 1 to 5. Additionally, a slightly positive pressure relative to the external environment of the substrate processing apparatus is maintained in each of the blocks 1 to 5 to prevent the entry of particles and contaminants from the external environment into the blocks 1 to 5.

The indexer block 1, the BARC block 2, the resist coating block 3, the development processing block 4 and the interface block 5 as described above are units into which the substrate processing apparatus of this first embodiment is divided in mechanical terms. The blocks 1 to 5 are assembled to individual block frames, respectively, which are in turn connected together to construct the substrate processing apparatus.

On the other hand, this first embodiment employs another type of units, that is, transport control units regarding the transport of substrates, aside from the blocks which are units based on the above-mentioned mechanical division. The transport control units regarding the transport of substrates are referred to herein as "cells." Each of the cells includes a transport robot responsible for the transport of substrates, and a transport destination part to which the transport robot transports a substrate. Each of the substrate rest parts described above functions as an entrance substrate rest part for the receipt of a substrate W into a cell or as an exit substrate rest part for the transfer of a substrate W out of a cell. The transfer of substrates W between the cells is also carried out through the substrate rest parts. The transport robots constituting the cells include the substrate transfer mechanism 12 of the indexer block 1 and the transport mechanism 55 of the interface block 5.

The substrate processing apparatus in this first embodiment includes six cells: an indexer cell, a BARC cell, a resist coating cell, a development processing cell, a post-exposure bake cell, and an interface cell. The indexer cell includes the table 11 and the substrate transfer mechanism 12, and is consequently similar in construction to the indexer block 1 which is one of the units based on the mechanical division. The BARC cell includes the bottom coating processor BRC, the pair of heat treatment towers 21 and the transport robot TR1. The BARC cell is also consequently similar in construction to the BARC block 2 which is one of the units based on the mechanical division. The resist coating cell includes the resist coating processor SC, the pair of heat treatment towers 31, and the transport robot TR2. The resist coating cell is also consequently similar in construction to the resist coating block 3 which is one of the units based on the mechanical division.

The development processing cell includes the development processor SD, the heat treatment tower 41, and the transport robot TR3. Because the transport robot TR3 cannot gain access to the heating parts PHP7 to PHP12 and the cool plate CP14 of the heat treatment tower 42 as discussed above, the development processing cell does not include the heat treatment tower 42. In these respects, the development processing cell differs from the development processing block 4 which is one of the units based on the mechanical division.

The post-exposure bake cell includes the heat treatment tower 42 positioned in the development processing block 4, the edge exposure part EEW positioned in the interface block 5, and the transport robot TR4 positioned in the interface block 5. That is, the post-exposure bake cell extends over the development processing block 4 and the interface block 5 which are units based on the mechanical division. In this manner, constituting one cell including the heating parts PHP7 to PHP12 for performing the post-exposure bake process and the transport robot TR4 allows the rapid transport of exposed substrates W into the heating parts PHP7 to PHP12 for the execution of the heat treatment. Such an arrangement is preferred for the use of a chemically amplified resist which is required to be subjected to a heating process as soon as possible after the exposure of a substrate W in a pattern.

The substrate rest parts PASS7 and PASS8 included in the heat treatment tower 42 are provided for the transfer of a substrate W between the transport robot TR3 of the development processing cell and the transport robot TR4 of the post-exposure bake cell. The interface cell includes the transport mechanism 55 for transferring and receiving a substrate W to and from the exposure unit EXP which is an external apparatus. The interface cell has a construction different from that of the interface block 5 which is one of the units based on the mechanical division in that the interface cell does not include the transport robot TR4 and the edge exposure part EEW. The substrate rest parts PASS9 and PASS11 under the edge exposure part EEW are provided for the transfer of a substrate W between the transport robot TR4 of the post-exposure bake cell and the transport mechanism 55 of the interface cell.

Figure 6:
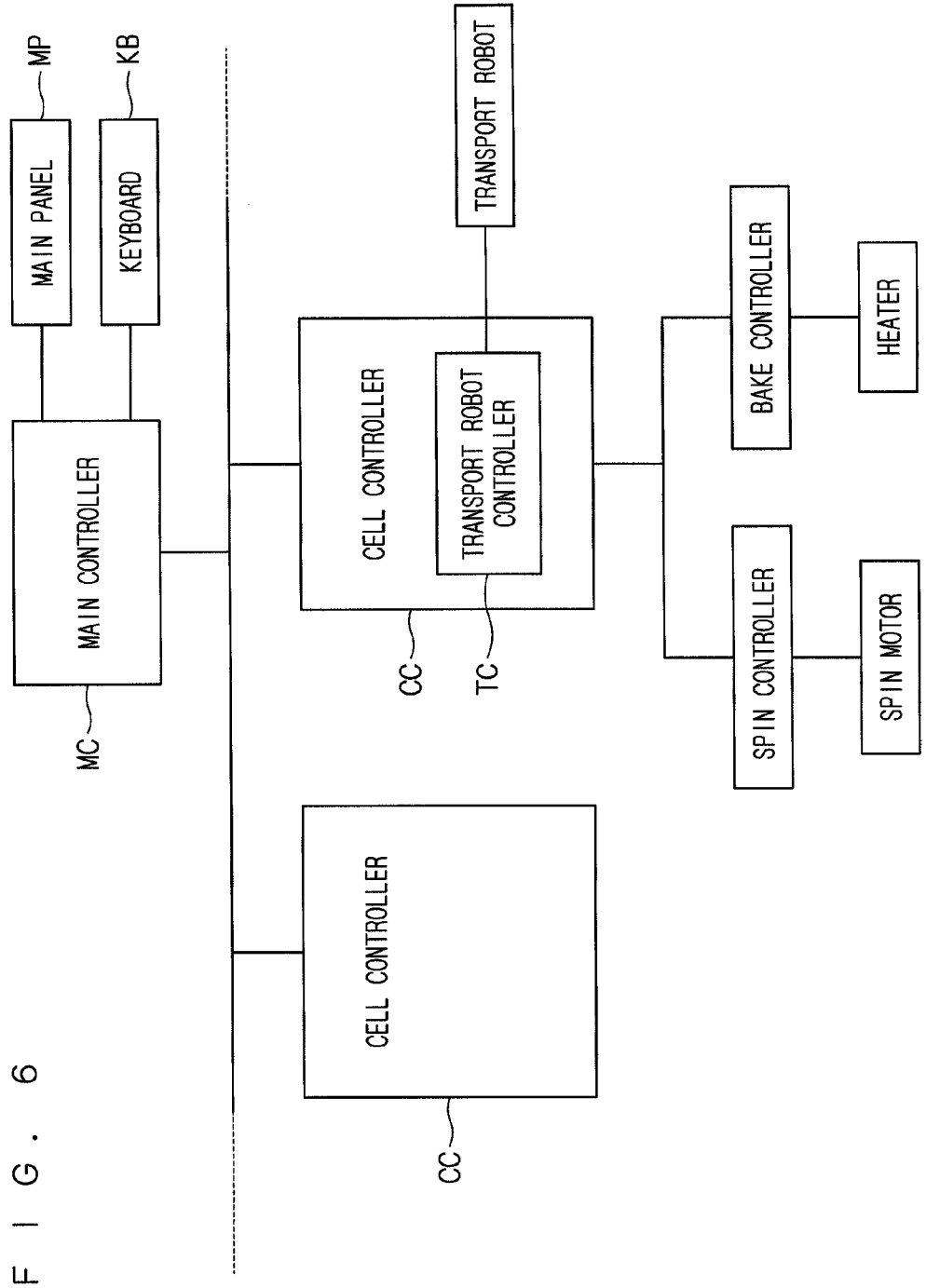
FIG. 6 is a block diagram schematically showing a control mechanism.

Next, a control mechanism in the substrate processing apparatus of the first embodiment will be described. FIG. 6 is a schematic block diagram of the control mechanism. As shown in FIG. 6 the substrate processing apparatus of the first embodiment has a three-level control hierarchy composed of a main controller MC, cell controllers CC, and unit controllers. The main controller MC, the cell controllers CC and the unit controllers are similar in hardware construction to typical computers. Specifically, each of the controllers includes a CPU for performing various computation processes, a ROM or read-only memory for storing a basic program therein, a RAM or readable/writable memory for storing various pieces of information therein, a magnetic disk for storing control applications and data therein, and the like.

The single main controller MC at the first level is provided for the entire substrate processing apparatus, and is principally responsible for the management of the entire substrate processing apparatus, the management of a main panel MP, and the management of the cell controllers CC. The main panel MP functions as a display for the main controller MC. Various commands may be entered into the main controller MC from a keyboard KB. The main panel MP may be in the form of a touch panel so that a user performs an input process into the main controller MC from the main panel MP.

The cell controllers CC at the second level are individually provided in corresponding relation to the six cells (the indexer cell, the BARC cell, the resist coating cell, the development processing cell, the post-exposure bake cell, and the interface cell). Each of the cell controllers CC is principally responsible for the control of the transport of substrates and the management of the units in a corresponding cell. Specifically, the cell controllers CC for the respective cells send and receive information in such a manner that a first cell controller CC for a first cell sends information indicating that a substrate W is placed on a predetermined substrate rest part to a second cell controller CC for a second cell adjacent to the first cell, and the second cell controller CC for the second cell having received the substrate W sends information indicating that the substrate W is received from the predetermined substrate rest part back to the first cell controller CC. Such sending and receipt of information are carried out through the main controller MC. Each of the cell controllers CC provides the information indicating that a substrate W is transported into a corresponding cell to a transport robot controller TC, which in turn controls a corresponding transport robot to circulatingly transport the substrate W in the corresponding cell in accordance with a predetermined procedure. The transport robot controller TC is a controller implemented by the operation of a predetermined application in the corresponding cell controller CC.

Examples of the unit controllers at the third level include a spin controller and a bake controller. The spin controller directly controls the spin units (the coating processing units and the development processing units) provided in a corresponding cell in accordance with an instruction given from a corresponding cell controller CC. Specifically, the spin controller controls, for example, a spin motor for a spin unit to adjust the number of revolutions of a substrate W. The bake controller directly controls the heat treatment units (the hot plates, the cool plates, the heating parts, and the like) provided in a corresponding cell in accordance with an instruction given from a corresponding cell controller CC. Specifically, the bake controller controls, for example, a heater incorporated in a hot plate to adjust a plate temperature and the like. The heating parts PHP7 to PHP12 of the above-mentioned development processing block 4 are controlled by the bake controller for the post-exposure bake cell.

The host computer 100 connected via the LAN lines to the substrate processing apparatus ranks as a higher level control mechanism than the three-level control hierarchy provided in the substrate processing apparatus (See FIG. 1). The host computer 100 includes a CPU for performing various computation processes, a ROM or read-only memory for storing a basic program therein, a RAM or readable/writable memory for storing various pieces of information therein, a magnetic disk for storing control applications and data therein, and the like. The host computer 100 is similar in construction to a typical computer. Typically, a plurality of substrate processing apparatuses according to this first embodiment are connected to the host computer 100. The host computer 100 provides a recipe containing descriptions about a processing procedure and processing conditions to each of the substrate processing apparatuses connected thereto. The recipe provided from the host computer 100 is stored in a storage part (e.g., a memory) of the main controller MC of each of the substrate processing apparatuses.

The exposure unit EXP is provided with a separate controller independent of the above-mentioned control mechanism of the substrate processing apparatus. In other words, the exposure unit EXP does not operate under the control of the main controller MC of the substrate processing apparatus, but controls its own operation alone. Such an exposure unit EXP also controls its own operation in accordance with a recipe received from the host computer 100, and the substrate processing apparatus performs processes synchronized with the exposure process in the exposure unit EXP.

Next, the operation of the substrate processing apparatus of the this first embodiment will be described. The control mechanism of FIG. 6 controls the parts in accordance with the descriptions of the recipe received from the host computer 100, whereby a procedure to be described below is executed.

First, unprocessed substrates W stored in a cassette C are transported from the outside of the substrate processing apparatus into the indexer block 1 by an AGV (automatic guided vehicle) and the like. Subsequently, the unprocessed substrates W are transferred outwardly from the indexer block 1.

Specifically, the substrate transfer mechanism 12 in the indexer cell (or the indexer block 1) takes an unprocessed substrate W out of a predetermined cassette C, and places the unprocessed substrate W onto the substrate rest part PASS1. After the unprocessed substrate W is placed on the substrate rest part PASS1, the transport robot TR1 of the BARC cell uses one of the holding arms 6a and 6b to receive the unprocessed substrate W. The transport robot TR1 transports the received unprocessed substrate W to one of the coating processing units BRC1 to BRC3. In the coating processing units BRC 1 to BRC3, the substrate W is spin-coated with the coating solution for the anti-reflective film.

After the completion of the coating process, the transport robot TR1 transports the substrate W to one of the hot plates HP1 to HP6. Heating the substrate W by the hot plate dries the coating solution to form the anti-reflective film serving as the undercoat on the substrate W. Thereafter, the transport robot TR1 takes the substrate W from the hot plate, and transports the substrate W to one of the cool plates CP1 to CP3, which in turn cools down the substrate W. In this step, one of the cool plates WCP may be used to cool down the substrate W. The transport robot TR1 places the cooled substrate W onto the substrate rest part PASS3.

Alternatively, the transport robot TR1 may be adapted to transport the unprocessed substrate W placed on the substrate rest part PASS1 to one of the adhesion promotion processing parts AHL1 to AHL3. In the adhesion promotion processing parts AHL1 to AHL3, the substrate W is heat-treated in a vapor atmosphere of HMDS, whereby the adhesion of the resist film to the substrate W is promoted. The transport robot TR1 takes out the substrate W subjected to the adhesion promotion process, and transports the substrate W to one of the cool plates CP1 to CP3, which in turn cools down the substrate W. Because no anti-reflective film is to be formed on the substrate W subjected to the adhesion promotion process, the cooled substrate W is directly placed onto the substrate rest part PASS3 by the transport robot TR1.

A dehydration process may be performed prior to the application of the coating solution for the anti-reflective film. In this case, the transport robot TR1 transports the unprocessed substrate W placed on the substrate rest part PASS1 first to one of the adhesion promotion processing parts AHL1 to AHL3. In the adhesion promotion processing parts AHL1 to AHL3, a heating process (dehydration bake) merely for dehydration is performed on the substrate W without supplying the vapor atmosphere of HMDS. The transport robot TR1 takes out the substrate W subjected to the heating process for dehydration, and transports the substrate W to one of the cool plates CP1 to CP3, which in turn cools down the substrate W. The transport robot TR1 transports the cooled substrate W to one of the coating processing units BRC1 to BRC3. In the coating processing units BRC1 to BRC3, the substrate W is spin-coated with the coating solution for the anti-reflective film. Thereafter, the transport robot TR1 transports the substrate W to one of the hot plates HP1 to HP6. Heating the substrate W in the hot plate forms the anti-reflective film serving as the undercoat on the substrate W. Thereafter, the transport robot TR1 takes the substrate W from the hot plate, and transports the substrate W to one of the cool plates CP1 to CP3, which in turn cools down the substrate W. Then, the transport robot TR1 places the cooled substrate W onto the substrate rest part PASS3.

After the substrate W is placed on the substrate rest part PASS3, the transport robot TR2 in the resist coating cell receives the substrate W, and transports the substrate W to one of the coating processing units SC1 to SC3. In the coating processing units SC1 to SC3, the substrate W is spin-coated with the resist. In the first embodiment, the substrate W is coated with a chemically amplified resist. Because the resist coating process requires precise substrate temperature control, the substrate W may be transported to one of the cool plates CP4 to CP9 immediately before being transported to the coating processing units SC1 to SC3.

After the completion of the resist coating process, the transport robot TR2 transports the substrate W to one of the heating parts PHP1 to PHP6. In the heating parts PHP1 to PHP6, heating the substrate W removes a solvent component from the resist to form a resist film on the substrate W. Thereafter, the transport robot TR2 takes the substrate W from the one of the heating parts PHP1 to PHP6, and transports the substrate W to one of the cool plates CP4 to CP9, which in turn cools down the substrate W. Then, the transport robot TR2 places the cooled substrate W onto the substrate rest part PASS5.

After the substrate W with the resist film formed thereon by the resist coating process is placed on the substrate rest part PASS5, the transport robot TR3 in the development processing cell receives the substrate W, and places the substrate W onto the substrate rest part PASS7 without any processing of the substrate W. Then, the transport robot TR4 in the post-exposure bake cell receives the substrate W placed on the substrate rest part PASS7, and transports the substrate W to one of the edge exposure units EEW1 and EEW2. In the edge exposure units EEW1 and EEW2, a peripheral edge portion of the substrate W is exposed to light (an edge exposure process). The transport robot TR4 places the substrate W subjected to the edge exposure process onto the substrate rest part PASS9. The transport mechanism 55 in the interface cell receives the substrate W placed on the substrate rest part PASS9, and transports the substrate W into the exposure unit EXP. The substrate W transported into the exposure unit EXP is subjected to the pattern exposure process. Because the chemically amplified resist is used in this first embodiment, an acid is formed by a photochemical reaction in the exposed portion of the resist film formed on the substrate W. The substrate W subjected to the edge exposure process may be transported to the cool plate CP14 for the cooling process by the transport robot TR4 before being transported into the exposure unit EXP.

The exposed substrate W subjected to the pattern exposure process is transported from the exposure unit EXP back to the interface cell again. The transport mechanism 55 places the exposed substrate W onto the substrate rest part PASS10. After the exposed substrate W is placed on the substrate rest part PASS10, the transport robot TR4 in the post-exposure bake cell receives the substrate W, and transports the substrate W to one of the heating parts PHP7 to PHP12. It is assumed that the exposed substrate W is transported to the heating part PHP7 in the description below.

The exposed substrate W is transported into the temporary substrate rest part 719 of the heating part PHP7 and placed onto the fixed support pins 723 by the transport robot TR4. The exposed substrate W is then received by the chilled arm CA of the local transport mechanism 720. The chilled arm CA transports the exposed substrate W from the temporary substrate rest part 719 to the heating plate 710. The substrate W is placed on the upper surface of the heating plate 710, and the top cover 722 moves downwardly, whereby the heating process by the heating plate 710 proceeds. This heating process is a post-exposure bake process which causes reactions such as crosslinking, polymerization and the like of the resist resin to proceed by using a product formed by the photochemical reaction during the exposure process as an acid catalyst, thereby locally changing the solubility of only the exposed portion of the resist resin in the developing solution, and is an important step which exerts a significant influence on the line width of a pattern. The heating temperature in the post-exposure bake process according to the first embodiment is approximately 130° C.

After the completion of the post-exposure bake process for a predetermined time period, the top cover 722 moves upwardly, and the movable support pins 721 move upwardly to lift the substrate W. The chilled arm CA of the local transport mechanism 720 receives the heat-treated substrate W, and transports the substrate W to the temporary substrate rest part 719.

In this process, the temperature of the holding surface of the chilled arm CA is previously controlled at predetermined temperatures by the two temperature control mechanisms, that is, the water-cooling mechanism (or the first temperature control mechanism) employing the circulation of the cooling water or other suitable fluid and the heating mechanism (or the second temperature control mechanism) employing the polyimide or other suitable heaters. The water-cooling mechanism is intended to control the temperature of the entire holding area EA of the holding surface at the reference temperature (approximately 20° C.). The heating mechanism according to the first embodiment, on the other hand, includes the six polyimide heaters 741 to 746, the temperatures of which are controlled independently of each other. Thus, the six polyimide heaters 741 to 746 are controllable to provide either the same or different heating temperatures from each other. For example, a region to which a polyimide heater supplied with no power is affixed is maintained at the above-mentioned reference temperature, and a region to which a polyimide heater supplied with the greatest power is affixed is heated up to approximately 80° C. The temperatures controlled by the polyimide heaters 741 to 746 are lower than the heating temperature in the post-exposure bake process (130° C.). The chilled arm CA receives the substrate W subjected to the post-exposure bake process, whereby the cooling process of the substrate W proceeds.

The chilled arm CA the temperatures of which are controlled to have such a distribution receives the substrate W immediately after the post-exposure bake process. This cools down the substrate W to stop the chemical reaction of the resist resin. The temperature at which the chemical reaction of the resist resin stops is rated as lower than the treatment temperature of the post-exposure bake process by approximately 30° C. to 50° C. Even a region the temperature of which is controlled at 80° C. by a polyimide heater is cooled down, and the above-mentioned chemical reaction in the region stops. In other words, all of the temperatures controlled by the polyimide heaters 741 to 746 are not higher than the temperature at which the reaction of the resist resin stops.

There is, of course, a difference in cooling rate between a region heated to a greater extent by a polyimide heater and a region heated to a lesser extent by a polyimide heater. The cooling rate in a region maintained at a temperature close to the above-mentioned reference temperature is high, and the cooling rate in a region heated and controlled at a temperature higher than the reference temperature decreases with the degree of separation from the reference temperature. Thus, the time at which the chemical reaction of the resist resin stops varies slightly between the regions corresponding to the polyimide heaters 741 to 746, the technical significance of which will be described later.

The substrate W cooled by the chilled arm CA until the chemical reaction of the post-exposure bake process stops is transported into the temporary substrate rest part 719, and is placed on the fixed support pins 723. Subsequently, the transport robot TR4 in the post-exposure bake cell takes the substrate W out of the temporary substrate rest part 719, and places the substrate W onto the substrate rest part PASS8.

After the substrate W is placed on the substrate rest part PASS8, the transport robot TR3 in the development processing cell receives the substrate W, and transports the substrate W to one of the cool plates CP10 to CP13. In the cool plates CP10 to CP13, the substrate W subjected to the post-exposure bake process is further cooled down and precisely controlled at a predetermined temperature. Thereafter, the transport robot TR3 takes the substrate W from the one of the cool plates CP10 to CP13, and transports the substrate W to one of the development processing units SD1 to SD5. In the development processing units SD1 to SD5, the developing solution is applied onto the substrate W to cause the development process to proceed. After the completion of the development process, the transport robot TR3 transports the substrate W to one of the hot plates HP7 to HP11, and then transports the substrate W to one of the cool plates CP10 to CP13.

Thereafter, the transport robot TR3 places the substrate W onto the substrate rest part PASS6. The transport robot TR2 in the resist coating cell places the substrate W from the substrate rest part PASS6 onto the substrate rest part PASS4 without any processing of the substrate W. Next, the transport robot TR1 in the BARC cell places the substrate W from the substrate rest part PASS4 onto the substrate rest part PASS2 without any processing of the substrate W, whereby the substrate W is stored in the indexer block 1. Then, the substrate transfer mechanism 12 in the indexer cell stores the processed substrate W held on the substrate rest part PASS2 into a predetermined cassette C. Thereafter, the cassette C in which a predetermined number of processed substrates W are stored is transported to the outside of the substrate processing apparatus. Thus, a series of photolithography processes are completed.

As discussed above, the step of the post-exposure bake process in the heating parts PHP7 to PHP12 is considered to exert the greatest influence upon the line width of the pattern after exposure. It is hence necessary that the temperature distribution of the substrate W in the course of the resist resin reaction is held uniform in the post-exposure bake process. Conventionally, techniques have been developed to increase the temperature of the substrate W uniformly by the heating plate 710 and to maintain the substrate W at a heating temperature for a certain period of time so as to provide a uniform temperature distribution. However, no matter how accurately the temperature distribution uniformity during the increase in temperature and during the heating process is maintained, natural cooling due to heat dissipation starts at the same time that the movable support pins 721 move upwardly to lift the substrate W after the heating process. At this time, more heat is dissipated from a peripheral portion of the substrate W than from a central portion thereof, so that the temperature of the peripheral portion decrease more significantly. On the other hand, only the movable support pins 721 moving upwardly to lift the substrate W cannot decrease the temperature of the substrate W down to a degree at which the above-mentioned chemical reaction in the post-exposure bake process stops. Thus, until the substrate W is received by the chilled arm, the chemical reaction of the resist resin proceeds while a nonuniform temperature distribution is provided due to natural cooling.

In the conventional techniques, the substrate W is then entirely cooled rapidly by the chilled arm which receives the substrate W, whereby the chemical reaction of the resist resin stops substantially simultaneously throughout the substrate W. Thus, a line width distribution tendency resulting from the temperature distribution caused by natural cooling immediately after the upward movement of the movable support pins 721 remains as it is after the cooling (or after the stop of the reaction). Specifically, there is a tendency toward the greater line width of a pattern in the peripheral portion of the substrate W from which more heat is dissipated during the natural cooling than in the central portion of the substrate W.

To solve such a problem, the chilled arm CA according to the first embodiment is adapted to control the temperatures so that the temperatures controlled by the polyimide heaters 743 to 746 affixed to the peripheral portion of the holding area EA are higher than the temperatures of the polyimide heaters 741 and 742 affixed to the inside. This makes the cooling rate lower in the peripheral portion of the substrate W when the substrate W is received by the chilled arm CA and forcibly cooled, whereby the chemical reaction of the resist resin stops in the peripheral portion of the substrate W at a later time than in the central portion thereof.

FIG. 11 shows a temperature history immediately after the post-exposure bake process of the substrate W. At time t1, the post-exposure bake process is completed, and the natural cooling starts when the substrate W is lifted by the movable support pins 721. During this natural cooling, the temperature decrease is greater in the peripheral portion from which more heat is dissipated than in the central portion. Thereafter, the substrate W is received by the chilled arm CA and the forcible cooling starts at time t2. At this time, the cooling rate is lower in the peripheral portion of the substrate W than in the central portion thereof, and the time at which a reaction stop temperature T1 is reached is later in the peripheral portion than in the central portion. As a result, the line width distribution tendency (the tendency toward the greater line width in the peripheral portion from which more heat is dissipated) caused by the natural cooling during the time interval between the upward movement of the movable support pins 721 and the receipt of the substrate W by the chilled arm CA (between the time t1 and the time t2) is canceled out by the forcible cooling of the chilled arm CA. This provides excellent line width uniformity.

The temperature control of the chilled arm CA is always carried out when the substrate processing apparatus is in operation. The temperature control is effected also when the exposed substrate W is transported from the temporary substrate rest part 719 to the heating plate 710 by the chilled arm CA. In the instance of the first embodiment, the peripheral portion of the exposed substrate W is slightly higher in temperature than the central portion thereof when the exposed substrate W is being transported to the heating plate 710 because the temperature control is done so that the temperatures of the polyimide heaters 743 to 746 affixed to the peripheral portion of the holding area EA are higher than the temperatures of the polyimide heaters 741 and 742 affixed to the inside thereof. As a result, the peripheral portion of the substrate W receives a greater amount of heat. This also serves to cancel out the line width distribution tendency caused by the natural cooling during the time interval between the upward movement of the movable support pins 721 and the receipt of the substrate W by the chilled arm CA.

In the first embodiment, the two temperature control mechanisms intentionally produce a temperature distribution in the holding area EA of the chilled arm CA so as to substantially cancel out the nonuniformity of the temperature distribution which inevitably occurs at the instant when the post-exposure bake process by the heating plate 710 is completed and the movable support pins 721 move upwardly. The chilled arm CA is used to transport the substrate W before the heating process to the heating plate 710 and to transport the substrate W after the heating process from the heating plate 710. This reduces or eliminates the nonuniformity of the temperature distribution which typically occurs to consequently achieve the uniform heat treatment throughout the post-exposure bake process, thereby providing the desired uniform line width.

Further, the first embodiment, in which the six polyimide heaters 741 to 746 serving as the second temperature control mechanism are affixed to the holding surface of the chilled arm CA, is capable of producing an intentional temperature distribution relatively easily. Another technique is conceivable which produces a temperature distribution by dividing the heating plate 710 itself into a plurality of zones. This technique, however, is required to attain a slight temperature difference (e.g., 0.1° C. to 0.2° C.) between the zones, resulting in great difficulties in temperature control between the zones. When a difference in cooling rate is made by the polyimide heaters 741 to 746 affixed to the holding surface of the chilled arm CA, a relatively large temperature difference is needed as in the first embodiment. This makes the temperature control between the heaters relatively easily. Also, temperature interference between adjacent ones of the polyimide heaters is relatively unlikely to occur on the holding surface of the chilled arm CA.

Additionally, the first embodiment is intended to produce the uniform line width throughout the photolithography process, but may intentionally provide a temperature distribution which produces nonuniform line widths to the chilled arm CA in consideration for subsequent steps. In the manufacturing steps of a semiconductor device, the photolithography process is followed by an etching process. In the etching process step, there is observed a tendency toward the nonuniform line widths of the pattern. To solve the problem, a temperature distribution which cancels out the line width distribution tendency in the etching step is provided to the chilled arm CA. Specifically, a temperature distribution is provided to the holding area EA of the chilled arm CA so that a region in which the line widths become large in the etching process step is at a higher temperature. This causes the line width nonuniformity at the time of the completion of the photolithography process, but accomplishes the uniform line width after the execution of the etching process.

Second Embodiment

Next, a second embodiment according to the present invention will be described. The substrate processing apparatus according to the second embodiment is similar in overall construction and in procedure of a substrate W to that of the first embodiment. The second embodiment differs from the first embodiment in construction of the chilled arm CA. FIG. 12 is a sectional view showing an internal structure of the chilled arm CA according to the second embodiment of the present invention.

In the second embodiment, a metal plate 750 is further provided on the six polyimide heaters 741 to 746. The polyimide heaters 741 to 746, which are thin soft film heaters, are liable to develop slight unevenness when affixed. The substrate W is supported by the plurality of support pins 727. The presence of such slight unevenness of the polyimide heaters 741 to 746 causes part of the polyimide heaters 741 to 746 to directly contact the substrate W, resulting in the occurrence of an unintended temperature distribution. For this reason, the second embodiment provides the metal plate 750 serving as a retainer plate for the polyimide heaters 741 to 746 to reduce or eliminate the influence of the unevenness. In the second embodiment, the support pins 727 are mounted upright on the upper surface of the metal plate 750.

Such a structure prevents the polyimide heaters 741 to 746 from directly contacting the substrate W in addition to producing effects similar to those of the first embodiment. In place of the provision of the metal plate 750, the provision of the polyimide heaters 741 to 746 buried just under the holding surface of the chilled arm CA produces similar effects. However, if the thickness of the metal plate 750 is relatively large or a distance from the holding surface to the polyimide heaters 741 to 746 is relatively large, the mutual temperature influence between adjacent ones of the polyimide heaters 741 to 746 is increased to make it difficult to produce an intentional temperature distribution. It is therefore preferable that the thickness of the metal plate 750 is not greater than a predetermined thickness or that the distance from the holding surface to the polyimide heaters 741 to 746 is not greater than a predetermined distance.

Third Embodiment

Next, a third embodiment according to the present invention will be described. The substrate processing apparatus according to the third embodiment is generally similar in overall construction and in procedure of a substrate W to that of the first embodiment. The third embodiment differs from the first embodiment in construction of the heating parts PHP7 to PHP12. FIG. 13 is a view showing the construction of the heating part PHP7 according to the third embodiment of the present invention.

The two temperature control mechanisms, which are provided in the chilled arm CA according to the first embodiment, are provided in the temporary substrate rest part 719 according to the third embodiment. Specifically, a flow passage pipe 717 for circulating cooling water is provided in the floor plate 718 of the temporary substrate rest part 719, and the six polyimide heaters 741 to 746 similar to those of the first embodiment are affixed to the upper surface of the floor plate 718.

In the first embodiment, the two temperature control mechanisms are provided in the chilled arm CA so that the temperature distribution which typically occurs due to the natural cooling immediately after the completion of the post-exposure bake process is canceled out before and after the post-exposure bake process. The temperature distribution which inevitably occurs may be canceled out at any instant before and after the post-exposure bake process. The third embodiment intentionally provides a temperature distribution which cancels out the above-mentioned temperature distribution to a substrate W in the temporary substrate rest part 719 through which the substrate W before and after the heating process always passes.

Such a structure produce effects similar to those of the first embodiment. However, when the substrate W after the post-exposure bake process is cooled in the temporary substrate rest part 719 as in the third embodiment, it takes a relatively long time to stop the chemical reaction of the resist resin after the completion of the process. For this reason, it is preferable to provide the temperature control mechanisms in the chilled arm CA as in the first embodiment to cool the substrate W immediately after the post-exposure bake process in the transport step using the chilled arm CA.

From the viewpoint of canceling out the temperature distribution which inevitably occurs before and after the post-exposure bake process, the transport arm of the transport robot TR4 in the post-exposure bake cell which transports a substrate W to the heating parts PHP7 to PHP12 may be made similar in construction to the chilled arm CA to intentionally provide a temperature distribution to the substrate W when the substrate W is transported to the heating parts PHP7 to PHP12 and/or when the substrate W is transported from the heating parts PHP7 to PHP12.

Fourth Embodiment

Figure 14:
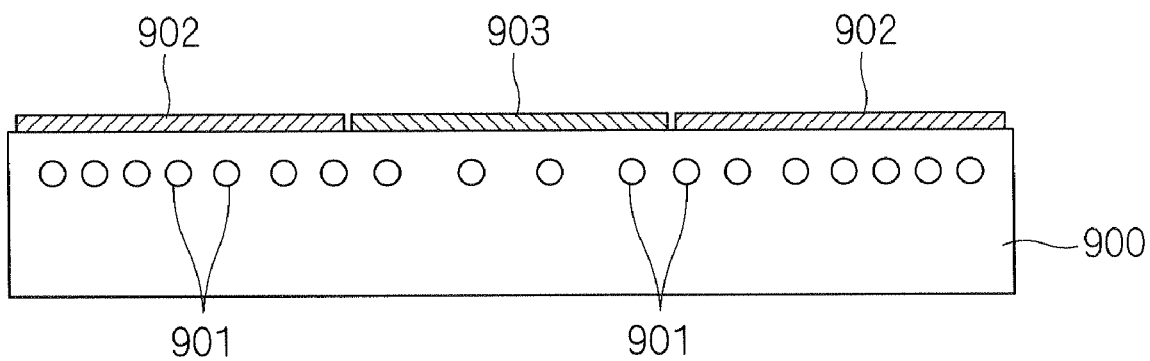
FIG. 14 is a view showing a construction of a heat treatment plate according to a fourth embodiment of the present invention.

Next, a fourth embodiment according to the present invention will be described. FIG. 14 is a view showing the construction of a heat treatment plate 900 according to the fourth embodiment of the present invention. The heat treatment plate 900 is a heating plate such that heaters 901 composed of resistance heating wires are buried in the plate. The heaters 901 control the temperature of at least a holding area of a holding surface of the heat treatment plate 900 which is opposed to a substrate W. The heaters 901 are not equally spaced, but are disposed to have a higher distribution density in a peripheral portion of the heat treatment plate 900. This is adapted to the tendency of the peripheral portion of a substrate heated by the heat treatment plate 900 to dissipate more heat, thereby exhibiting a greater decrease in temperature.

A plurality of polyimide heaters 902 and 903 are affixed to the upper surface of the heat treatment plate 900. The polyimide heater 903 is affixed to a central portion of the upper surface of the heat treatment plate 900, and the polyimide heater 902 is affixed to a peripheral portion of the upper surface of the heat treatment plate 900. The polyimide heaters 902 and 903 are identical with the polyimide heaters 741 to 746 of the first embodiment. The polyimide heaters 902 and 903 control the temperature of at least a portion of the above-mentioned holding area in addition to the temperature control of the heaters 901.

When the heat treatment plate 900 performs a heating process on a substrate, the heaters 901 do not always produce 100% output, but produce an output varying as appropriate. For example, the heaters 901 produce 30% output when maintaining the heat treatment plate 900 at a predetermined temperature, and produce 80% output when changing the temperature to a higher temperature. When the distribution of the heaters 901 in the heat treatment plate 900 is appropriate for the 30% output, the plate temperature in the peripheral portion having a higher distribution density is too high for the 80% output. For the 80% output, the polyimide heater 903 affixed to the central portion of the plate performs auxiliary heating to achieve a balance with the peripheral portion. On the other hand, when the distribution of the heaters 901 is appropriate for the 80% output, the polyimide heater 902 affixed to the peripheral portion of the plate performs auxiliary heating to achieve a balance with the central portion.

In other words, the fourth embodiment intentionally provides a temperature distribution to the polyimide heaters 902 and 903 to reduce or eliminate the nonuniformity of the temperature distribution which typically occurs due to the output from the heaters 901. The polyimide heaters 902 and 903 can be referred to as assist heaters for the heaters 901. This allows a uniform heat treatment throughout the heat treatment process step if the heaters 901 produce a varying output.

MODIFICATIONS

Although the various embodiments according to the present invention have been described hereinabove, various modifications in addition to the above may be made therein without departing from the spirit and scope of the present invention. For example, the plurality of polyimide heaters are used as the second temperature control mechanism for correction in the above-mentioned embodiments, a plurality of independently temperature-controllable Peltier devices may be used in place of the polyimide heaters. The Peltier devices are capable of cooling in addition to heating to provide greater variations in the temperature distribution to be intentionally provided to the holding area of the holding surface.

Additionally, because the Peltier devices are capable of both heating and cooling, a desired temperature distribution may be provided to the holding area only by the plurality of Peltier devices without the provision of the first temperature control mechanism.

Although the first to third embodiments include the cooling mechanism employing the circulation of cooling water as the first temperature control mechanism, and the heating mechanism employing the polyimide heaters as the second temperature control mechanism, the present invention is not limited to this. A heating mechanism for heating the entire holding area of the holding surface to a predetermined reference temperature may be provided as the first temperature control mechanism, and a heating mechanism or a cooling mechanism for controlling the temperature of at least a portion of the holding area at a temperature different from the reference temperature may be provided as the second temperature control mechanism.

Further, the number of polyimide heaters provided as the second temperature control mechanism may be any number not less than two, and the pattern of the temperature distribution to be provided to the holding area of the holding surface may be any pattern. As an example, since regions of the chilled arm CA which are near the two slits 731 cannot circulate the cooling water to become low in cooling power, the second temperature control mechanism may be used to make the temperature of the regions near the slits 731 lower than the temperatures of other regions.

Also, the number of polyimide heaters provided as the second temperature control mechanism may be one. One polyimide heater may be provided as a part of the holding area EA (e.g., an area opposed to the peripheral edge of a substrate W, an area opposed to the central portion of the substrate W), so that the temperature thereof becomes different from the temperature of other areas.

The chilled arm CA similar to that of the first and second embodiments may be applied to the local transport mechanism 34 of the resist coating block 3 (See FIG. 1). This eliminates the nonuniformity of the temperature distribution after the resist coating process to improve the uniformity of the resist film thickness.

The heating part PHP7 serving as the heat treatment apparatus according to the present invention may be incorporated in the BARC block 2 in place of the hot plates HP1 to HP6. In the firing process of the anti-reflective film in the BARC block 2, it is known that a large amount of sublimate is produced from the coating solution for the anti-reflective film to become a cause of various problems. To solve the problem, a two-stage bake process has been contemplated which includes performing a heating process at a relatively low temperature after the coating of the substrate W with the coating solution, and then performing a firing process at a higher temperature. When the two-stage bake process is performed, it is preferable to perform a cooling process after the high-temperature bake by using the chilled arm CA of the heating part for the purpose of suppressing the increase in the number of process steps. However, only the provision of the cooling power such as the cooling water circulation to the chilled arm CA results in the forcible cooling of the substrate W by the chilled arm CA in the transport step transitioning from the low-temperature bake to the high-temperature bake. To solve the problem, the provision of the second temperature control mechanism for correction in the chilled arm CA as in the first embodiment allows the cooling power of the chilled arm CA to weaken, thereby suppressing the decrease in temperature of the substrate W during the transition from the low-temperature bake to the high-temperature bake.

The cooling water for use in the cooling mechanism in the first to third embodiments may be replaced with air, cold air, temperature-controlled water (constant-temperature water), fluorine-based inert chemical solutions.

The construction of the substrate processing apparatus with the heat treatment apparatus according to the present invention incorporated therein is not limited to the configuration shown in FIGS. 1 to 4, but various arrangements and configurations may be employed.

While the invention has been described in detail, the foregoing description is in all aspects illustrative and not restrictive. It is understood that numerous other modifications and variations can be devised without departing from the scope of the invention.

What is claimed is:

1. A heat treatment apparatus for performing a predetermined heat treatment process on a substrate, the heat treatment apparatus comprising:
   a substrate transfer part configured to support the substrate and to transfer the substrate to and from an outside of the heat treatment apparatus;
   a heat treatment part configured to perform the predetermined heat treatment process on the substrate;
   a transport arm having a holding surface, the transport arm being configured to receive and hold the substrate on the holding surface;
   an arm drive element coupled to the transport arm and configured to:
      move the transport arm from the substrate transfer part to the heat treatment part; and
      move the transport arm from the heat treatment part to the substrate transfer part;
   a reference temperature control element configured to control a temperature of a holding area of the holding surface of the transport arm at a reference temperature, the holding area of the holding surface being opposed to the substrate;
   a corrective temperature control element configured to control a temperature of each of a plurality of portions of the holding area when the temperature of the substrate in contact with the portion of the holding area is different from the reference temperature, making the temperature of a peripheral portion of the substrate higher than the temperature of a center portion after the substrate is received on the holding surface; and
   a temperature controller for causing the corrective temperature control element to produce a first non-uniform temperature distribution across the holding area so as to counteract a second non-uniform temperature distribution present in the substrate.

2. The heat treatment apparatus of claim 1 wherein:
   the predetermined heat treatment process is a substrate heating process performed at a predetermined heating temperature; and
   the reference temperature and the one or more temperatures different from the reference temperature are lower than the predetermined heating temperature.

3. The heat treatment apparatus of claim 2 wherein:
the predetermined heat treatment is a post-exposure bake process for a substrate with a chemically amplified resist film exposed to light in a pattern; and
the reference temperature and the one or more temperatures different from the reference temperature are not higher than a temperature at which a chemical reaction of the resist film stops.

4. The substrate transport apparatus of claim 1 wherein the corrective temperature control element includes a plurality of film heaters affixed to the holding surface, the plurality of film heaters being independently temperature-controllable.

5. The substrate transport apparatus of claim 4 wherein the plurality of film heaters comprises a plurality of polyimide heaters.

6. The substrate transport apparatus of claim 1 wherein the corrective temperature control element includes a plurality of film heaters buried under the holding surface, the plurality of film heaters being independently temperature-controllable.

7. The substrate transport apparatus of claim 6 further comprising a metal plates mounted on the plurality of polyimide heaters.

8. The substrate transport apparatus of claim 1 wherein the corrective temperature control element includes a plurality of Peltier devices affixed to the holding surface, the plurality of Peltier devices being independently temperature-controllable.

9. The substrate transport apparatus of claim 1 wherein the plurality of Peltier devices are buried under the holding surface.

10. A heat treatment apparatus for performing a post-exposure bake process on a substrate with a chemically amplified resist film exposed to light in a pattern, the heat treatment apparatus comprising:

a substrate transfer part having a holding surface configured to support the substrate, the substrate transfer part being configured to transfer the substrate to and from outside the heat treatment apparatus;

a heat treatment part configured to perform the post-exposure bake process on the substrate;

a transport arm configured to place the substrate on the holding part of the substrate transfer part;

an arm drive element configured to move the transport arm having received the substrate from the substrate transfer part to the heat treatment part and to move the transport arm having received the substrate from the heat treatment part to the substrate transfer part;

a reference temperature control element configured to control a temperature of a holding area of the holding surface of the substrate transfer part at a reference temperature, the holding area of the holding surface being opposed to the substrate;

a corrective temperature control element configured to control each temperature of at least one portion of the holding area when a temperature of the substrate in contact with the at least one portion of the holding area is different from the reference temperature, making the temperature of a peripheral portion of the substrate higher than the temperature of a center portion after the substrate is received on the holding surface; and a temperature controller configured to cause the corrective temperature control element to produce a first non-uniform temperature distribution across the holding area so as to counteract a second non-uniform temperature distribution present in the substrate.

11. The heat treatment apparatus of claim 10 wherein the substrate is either an unprocessed substrate or a processed substrate.

* * * * *